(12) United States Patent
Kim

(10) Patent No.: US 9,214,478 B2
(45) Date of Patent: Dec. 15, 2015

(54) DISPLAY PANEL AND METHOD OF MANUFACTURING THE SAME

(71) Applicant: Samsung Display Co., Ltd., Yongin, Gyeonggi-Do (KR)

(72) Inventor: TaeWoo Kim, Seoul (KR)

(73) Assignee: SAMSUNG DISPLAY CO., LTD. (KR)

(*) Notice: Subject to any disclaimer, the term of this patent is extended or adjusted under 35 U.S.C. 154(b) by 0 days.

(21) Appl. No.: 14/271,760

(22) Filed: May 7, 2014

(65) Prior Publication Data

US 2015/0069396 A1    Mar. 12, 2015

(30) Foreign Application Priority Data

Sep. 11, 2013  (KR) .................. 10-2013-0109213

(51) Int. Cl.
*H01L 27/12* (2006.01)

(52) U.S. Cl.
CPC .......... *H01L 27/124* (2013.01); *H01L 27/1259* (2013.01)

(58) Field of Classification Search
CPC ............... H01L 27/1214; H01L 27/12; G02F 1/136227
USPC ......................................................... 257/59
See application file for complete search history.

(56) References Cited

U.S. PATENT DOCUMENTS

| | | | |
|---|---|---|---|
| 7,608,541 B2 | 10/2009 | Yoo et al. | |
| 2007/0097072 A1* | 5/2007 | Kim et al. | 345/103 |
| 2008/0230775 A1* | 9/2008 | Rhee et al. | 257/40 |
| 2010/0014014 A1* | 1/2010 | Kim | 349/42 |

FOREIGN PATENT DOCUMENTS

| | | |
|---|---|---|
| JP | 2004-134771 | 4/2004 |
| KR | 10-2011-0076578 | 7/2011 |
| KR | 10-2012-0058072 | 6/2012 |
| KR | 10-1167312 | 7/2012 |
| KR | 10-2012-0112930 | 10/2012 |
| KR | 10-2013-0028249 | 3/2013 |
| KR | 10-1282327 | 7/2013 |

* cited by examiner

*Primary Examiner* — Karen Kusumakar
*Assistant Examiner* — Adam S Bowen
(74) *Attorney, Agent, or Firm* — Innovation Counsel LLP

(57) ABSTRACT

A display panel includes gate lines extending in a first direction, a first column insulating layer between the gate lines, a gate electrode disposed on the first column insulating layer. The first column insulating layer, the gate lines, and the gate electrode are covered by a gate insulating layer. An active layer is disposed on the gate insulating layer. Source and drain electrodes are disposed above the active layer. Data lines are connected to the source electrode. A second column insulating layer is interposed between the data lines and includes a first contact hole to expose the drain electrode. A contact electrode is disposed in the first contact hole and connected to the drain electrode, a second contact hole is formed through a protective layer to correspond to the first contact hole, and a pixel electrode is connected to the contact electrode through the second contact hole.

9 Claims, 51 Drawing Sheets

DISPLAY PANEL AND METHOD OF MANUFACTURING THE SAME

CROSS-REFERENCE TO RELATED APPLICATION

This U.S. non-provisional patent application claims priority under 35 U.S.C. §119 to Korean Patent Application No. 10-2013-0109213, filed on Sep. 11, 2013, the contents of which are hereby incorporated by reference in its entirety.

BACKGROUND

1. Field of Disclosure

The present disclosure relates to a display panel and a method of manufacturing the same. More particularly, the present disclosure relates to a display panel having an improved aperture ratio and a method of manufacturing the display panel.

2. Description of the Related Art

In general, a liquid crystal display includes a thin film transistor substrate, an opposite substrate, and a liquid crystal layer interposed between the thin film transistor substrate and the opposite substrate.

The thin film transistor substrate includes a plurality of pixels to display an image. Each pixel includes a thin film transistor and a pixel electrode. The thin film transistor receives gate and data signals respectively provided through gate and data lines and applies the data signal to the pixel electrode during a turn-on period of the gate signal.

Signal lines, i.e., gate and data lines, used for the liquid crystal display have a horizontal structure in which a width is greater than a thickness in each signal line. However, as a size of the liquid crystal display becomes larger or a resolution of the liquid crystal display becomes higher, there is a limitation to reduce the width of the signal lines, i.e., gate and data lines. In addition, when the width of the signal lines becomes larger to reduce a line resistance of the signal lines, an aperture ratio of the liquid crystal display is decreased.

SUMMARY

The present disclosure provides a display panel having a vertical structure in which a thickness thereof is greater than a width thereof to improve an aperture ratio.

The present disclosure provides a method of manufacturing the display panel.

Embodiments of the inventive concept provide a display panel including a plurality of gate lines extending in a first direction, a first column insulating layer interposed between the gate lines, a gate electrode branched from the gate line and disposed on the first column insulating layer, a gate insulating layer covering the first column insulating layer, the gate lines, and the gate electrode, an active layer disposed on the gate insulating layer to face the gate electrode, source and drain electrodes spaced apart from each other above the active layer, a plurality of data lines overlap the source electrode and extending in a second direction, a second column insulating layer interposed between the data lines and including a first contact hole formed therethrough to expose the drain electrode, a contact electrode disposed in the first contact hole and electrically connected to the drain electrode, a protective layer covering the second column insulating layer and the data lines and including a second contact hole formed therethrough to correspond to the first contact hole, and a pixel electrode electrically connected to the contact electrode through the second contact hole.

A ratio of a thickness in a third direction of each of the gate lines to a width in the second direction of each of the gate lines may be greater than 1.

The gate electrode may extend in the second direction on the first column insulating layer.

A ratio of a thickness in a third direction of each of the data lines to a width in the first direction of each of the data lines may be greater than 1.

An N-th gate line and an (N+1)th gate line among the gate lines may be spaced apart from each other by a first distance, the (N+1)th gate line and an (N+2)th gate line among the gate lines may be spaced apart from each other by a second distance smaller than the first distance, an M-th data line and an (M+1)th data line among the data lines may be spaced apart from each other by a third distance, and the (M+1)th data line and an (M+2)th data lines among the data lines may be spaced apart from each other by a fourth distance smaller than the third distance.

A first pixel connected to the N-th gate line and the M-th data line, a second pixel connected to the N-th gate line and the (M+1)th data line, a third pixel connected to the (N+1)th gate line and the M-the data line, and a fourth pixel connected to the (N+1)th gate line and the (M+1)th data line may be arranged in the rectangular area defined by the N-th gate line, (N+1)th gate line, the M-th data line and (M+1)th data line.

The first to fourth pixels may comprise first to fourth pixel electrodes, respectively, and the gate lines and the data lines may not be disposed between the first to fourth pixel electrodes.

Embodiments of the inventive concept provide a method of manufacturing a display panel, including forming a first column insulating layer on a base substrate, forming a gate line along a sidewall of the first column insulating layer, which extends in a first direction, forming a gate electrode electrically connected to the gate line and extending on the first column insulating layer, forming a gate insulating layer to cover the first column insulating layer, the gate line, and the gate electrode, forming an active layer on the gate insulating layer to face the gate electrode, forming source and drain electrodes spaced apart from each other by a predetermined distance above the active layer, forming a second column insulating layer exposing the source electrodes, the second column insulating layer including first contact holes exposing the drain electrodes, forming a data line disposed along a sidewall of the second column insulating layer and electrically connected to the source electrodes and a contact electrodes electrically connected to the drain electrodes through the first contact holes, forming a protective layer covering the second column insulating layer and the data line and including a second contact holes exposing the first contact holes, and forming pixel electrodes electrically connected to the contact electrodes through the second contact holes.

The forming of the first column insulating layer may include forming a first insulating material on the base substrate, forming a first photoresist pattern on the first insulating material, etching the first insulating material to form the first column insulating layer, and removing the first photoresist pattern.

The first insulating material may include one of silicon nitride, silicon oxycarbide, and polymer-based organic material.

The forming of the first column insulating layer may further include forming a hard-mask material on the first insulating material before the first photoresist pattern is formed.

The forming of the gate line may include forming a gate-line material on the first column insulating layer and the base substrate, and etching the gate-line material on an upper surface of the base substrate and the first column insulating layer to form the gate line extending along the sidewall of the first column insulating layer.

The forming of the gate line may further include forming a material having an etch selectivity different from the gate-line material on the gate-line material, and anisotropically etching the material having an etch selectivity and the gate-line material sequentially.

The method may further include forming an inter-insulating layer between the gate line formed on the sidewall of the first column insulating layer and a neighboring gate line formed on a sidewall of a first-neighboring column insulating layer disposed adjacent to the first column insulating layer.

The forming of the gate electrode may include forming a gate-electrode material on the first column insulating layer and the gate line, forming a second photoresist pattern on the gate-electrode material, etching the gate-electrode material to form the gate electrode, and removing the second photoresist pattern.

The forming of the active layer and the source and drain electrodes may includes sequentially forming an amorphous silicon layer, an n+ amorphous silicon layer, and a source/drain electrode material on the gate insulating layer, forming a third photoresist pattern on the source/drain electrode material, etching the source/drain electrode material to form the source and drain electrodes, etching the amorphous silicon layer and the n+ amorphous silicon layer to form the active layer in a channel region, and removing the third photoresist pattern.

The forming of the second column insulating layer may include forming a second insulating material on the gate insulating layer and the source and drain electrodes, forming a fourth photoresist pattern having a first contact pattern on the second insulating material, etching the second insulating material to form the second column insulating layer through which the first contact hole is formed, and removing the fourth photoresist pattern.

The forming of the data line and the contact electrode may includes forming a data-line material on the second column insulating layer and the gate insulating layer, and etching the data-line material disposed on an upper surface of the second column insulating layer and the gate insulating layer to form the data line extending along the sidewall of the second column insulating layer and the contact electrode electrically connected to the drain electrode through the first contact hole.

The forming of the protective layer may include forming the protective layer to cover the second column insulating layer and the data line, forming a fifth photoresist pattern on the protective layer on which a second contact pattern corresponding to the first contact hole is formed, and etching the protective layer to form the second contact hole corresponding to the first contact hole.

The forming of the pixel electrode may include forming a transparent conductive material on the protective layer, forming a sixth photoresist pattern on the transparent conductive material, and etching the transparent conductive material to form the pixel electrode.

Embodiments of the inventive concept provide a display panel including a first column insulating layer extending in a first direction, a plurality of gate lines disposed on sidewalls of the first column insulating layer, a plurality of data lines intersecting the plurality of gate lines, a plurality of pixel electrodes, and a plurality of thin film transistors each connected to a gate line, a data line and a pixel electrode. Each of the plurality of thin film transistors may include a gate electrode connected to the gate line, the gate electrode extending on the first column insulating layer in a second direction substantially perpendicular to the first direction, a gate insulating layer disposed on the gate electrodes, an active layer disposed on the gate insulating layer, a source electrode and a drain electrodes formed on the active layer, a data line connected to the source electrode, and a pixel electrode connected to the drain electrode. The display panel may further include a second column insulating layer disposed on the gate insulating layer and extending in the second direction. The data lines are disposed on sidewalls of a second column insulating layer.

The second column insulating layer maybe formed to expose the source electrode and the data line is electrically connected to the source electrode.

The second column insulating layer may include a first contact hole exposing the drain electrode.

According to the above, the gate and data lines have the vertical structure in which the width of the gate line and the data line is smaller than the thickness, and thus the aperture ratio of the display panel may be improved even though the gate and data lines have the same electrical conductivity as those of a conventional display panel.

In particular, when the display panel employs the gate and data lines having the vertical structure, the aperture ratio may be prevented from being lowered even though the electrical conductivity of the gate and data lines is increased in a high-resolution display panel.

BRIEF DESCRIPTION OF THE DRAWINGS

The above and other advantages of the present disclosure will be readily apparent with reference to the following detailed description and accompanying drawings wherein:

FIGS. 4A to 25A and 4B to 25B are cross-sectional views showing a manufacturing method of the display panel shown in FIG. 1;

DETAILED DESCRIPTION

Figure 1:
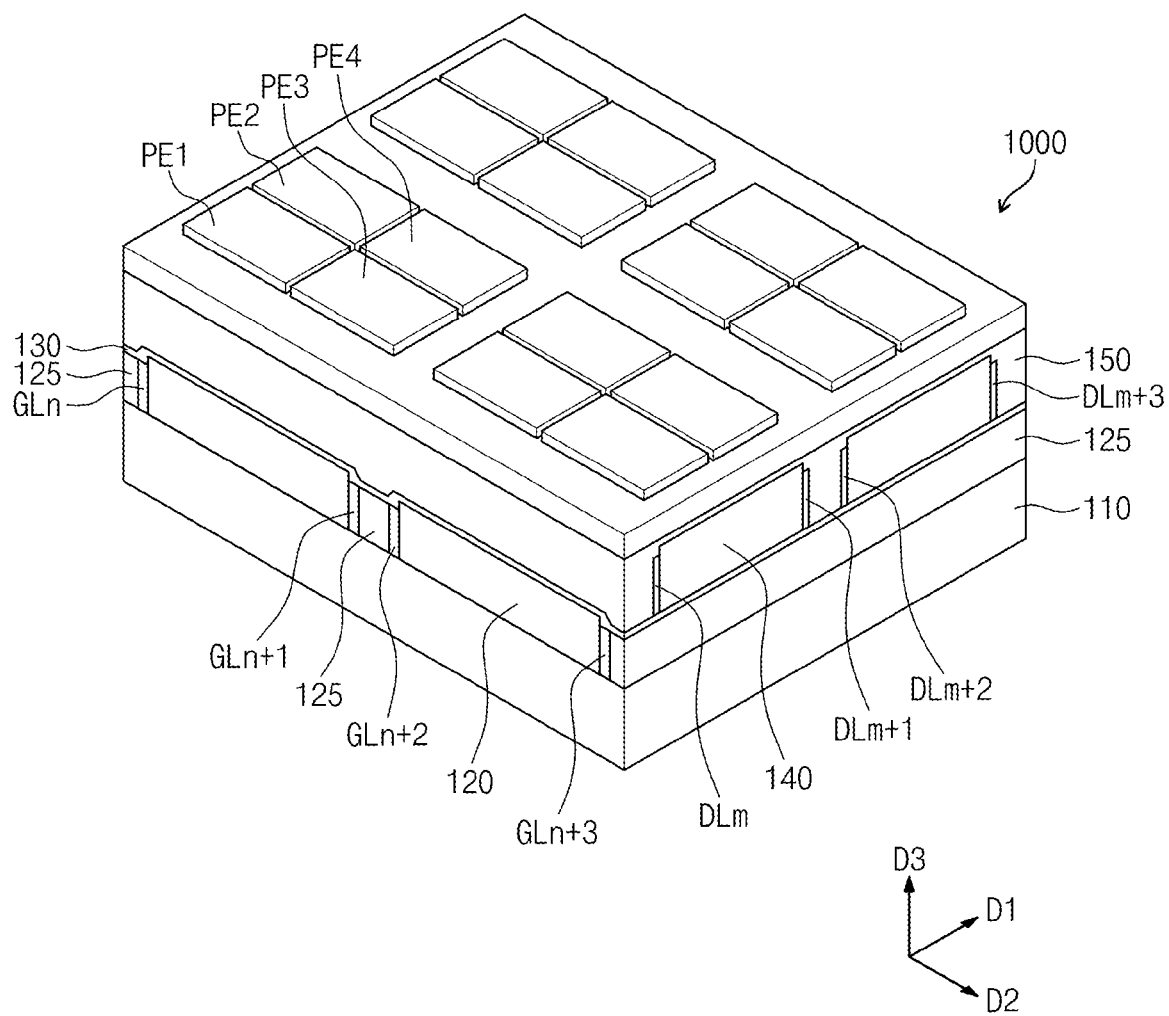
FIG. 1 is a perspective view showing a display panel according to an exemplary embodiment of the present disclosure.

It will be understood that when an element or layer is referred to as being "on", "connected to" or "coupled to" another element or layer, it can either be formed directly on, connected or coupled to the other element or layer or formed with intervening elements or layers. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, the described elements, components, regions, layers and/or sections are not limited by the terms used. The terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features may then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to limit the inventive concept. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Hereinafter, the inventive concept will be explained in detail with reference to the accompanying drawings.

Figure 2:
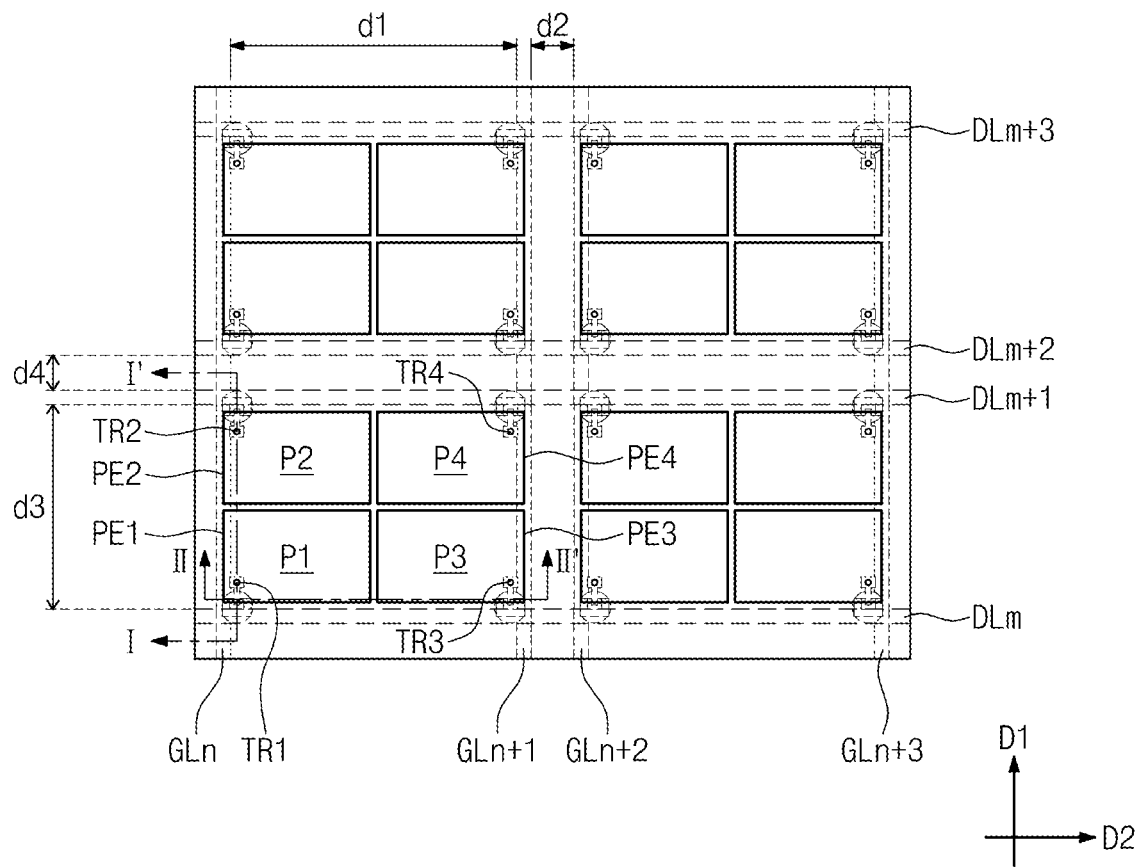
FIG. 2 is a plan view showing the display panel shown in FIG. 1.

FIG. 1 is a perspective view showing a display panel according to an exemplary embodiment of the present disclosure and FIG. 2 is a plan view showing the display panel shown in FIG. 1.

Referring to FIGS. 1 and 2, a display panel 1000 includes a base substrate 110, a plurality of gate lines GLn to GLn+3, a plurality of data lines DLm to DLm+3, a plurality of thin film transistors TR1 to TR4, and a plurality of pixel electrodes PE1 to PE4. The gate lines GLn to GLn+3 extend in a first direction D1 and the data lines DLm to DLm+3 extend in a second direction D2 different from the first direction D1. As an example, the second direction D2 is substantially perpendicular to the first direction D1 and the data lines DLm to DLm+3 are insulated from the gate lines GLn to GLn+3 while crossing the gate lines GLn to GLn+3.

Hereinafter, a direction substantially vertical to the first and second directions D1 and D2 is referred to as a third direction D3. An aspect ratio of each of the gate lines GLn to GLn+3, a ratio of a thickness in the third direction D3 of each of the gate lines GLn to GLn+3 to a width in the second direction D2 of each of the gate lines GLn to GLn+3, is greater than "1". That is, the width of each of the gate lines GLn to GLn+3 is smaller than the thickness of each of the gate lines GLn to GLn+3. In addition, an aspect ratio of each of the data lines DLm to DLm+3, a ratio of a thickness in the third direction D3 of each of the data lines DLm to DLm+3 to a width in the first direction D1 of each of the data lines DLm to DLm+3, is greater than "1". That is, the width of each of the data lines DLm to DLm+3 is smaller than the thickness of each of the data lines DLm to DLm+3.

In addition, a cross-sectional area of each of the gate lines GLn to GLn+3 is determined depending on a conductivity of each of the gate lines GLn to GLn+3. When the cross-sectional area of each of the gate lines GLn to GLn+3 is determined, the width and thickness of each of the gate lines GLn to GLn+3 may be determined by taking the cross-sectional area into consideration. The width and thickness of each of the gate lines GLn to GLn+3 may be adjusted to have the aspect ratio greater than "1".

Further, a cross-sectional area of each of the data lines DLm to DLm+3 is determined depending on a conductivity of each of the data lines DLm to DLm+3, and the width and thickness of each of the data lines DLm to DLm+3 may be determined by taking the cross-sectional area into consideration. The width and thickness of each of the data lines DLm to DLm+3 may be adjusted to have the aspect ratio greater than "1".

As described above, since the aspect ratio of the gate lines GLn to GLn+3 and the data lines DLm to DLm+3 is greater than 1, a total aperture ratio of the display panel 1000 may be improved when compared with a conventional display panel in which the width of each line is set to be greater than the thickness of each line in order to the desired conductivity of each line.

Referring to FIG. 2, the gate lines GLn to GLn+3 are arranged in the second direction D2 to be substantially in parallel to each other. Among the gate lines GLn to GLn+3, an N-th gate line GLn and an (N+1)th gate line GLn+1 are spaced apart from each other by a first distance d1 and the (N+1)th gate line GLn+1 and an (N+2)th gate line are spaced apart from each other by a second distance d2 smaller than the first distance d1. In addition, the data lines DLm to DLm+3 are arranged in the first direction D1 to be substantially in parallel to each other. Among the data lines DLm to DLm+3, an M-th data line DLm and an (M+1)th data line DLm+1 are spaced apart from each other by a third distance d3, and the (M+1)th data line DLm+1 and an (M+2)th data line DLm+2 are spaced apart from each other by a fourth distance d4 smaller than the third distance d3.

In a rectangular area defined by the N-th and (N+1)th gate lines GLn and GLn+1 and the M-th and (M+1)th data lines DLm and DLm+1, first, second, third, and fourth pixels P1, P2, P3, and P4 are arranged. The first pixel P1 is connected to the N-th gate line GLn and the M-th data line DLm, the second pixel P2 is connected to the N-th gate line GLn and the (M+1)th data line DLm+1, the third pixel P3 is connected to the (N+1)th gate line GLn+1 and the M-th data line DLm, and the fourth pixel P4 is connected to the (N+1)th gate line GLn+1 and the (M+1)th data line DLm+1.

In detail, the first pixel P1 includes a first thin film transistor TR1 connected to the N-th gate line GLn and the M-th data line DLm and a first pixel electrode PE1 connected to the first thin film transistor TR1. The second pixel P2 includes a second thin film transistor TR2 connected to the N-th gate line GLn and the (M+1)th data line DLm+1 and a second pixel electrode PE2 connected to the second thin film transistor TR2. The third pixel P3 includes a third thin film transistor TR3 connected to the (N+1)th gate line GLn+1 and the M-th data line DLm and a third pixel electrode PE3 connected to the third thin film transistor TR3. The fourth pixel P4 includes a fourth thin film transistor TR4 connected to the (N+1)th gate line GLn+1 and the (M+1)th data line DLm+1 and a fourth pixel electrode PE4 connected to the fourth thin film transistor TR4.

The first to fourth pixel electrodes PE1 to PE4 are spaced apart from each other at regular intervals and electrically insulated from each other, but the gate and data lines are not disposed in the space between the first to fourth pixel electrodes PE1 to PE4.

Referring to FIG. 1 again, a first column insulating layer 120 is interposed between the N-th and (N+1)th gate lines GLn and GLn+1 and between the (N+2)th and (N+3)th gate lines GLn+2 and GLn+3. An inter-insulating layer 125 is interposed between the (N+1)th and (N+2)th gate lines GLn+1 and GLn+2. The first column insulating layer 120 interposed between the N-th and (N+1)th gate lines GLn and GLn+1 and the first column insulating layer 120 (hereinafter, referred to as first-neighboring column insulating layer) between the (N+2)th and (N+3)th gate lines GLn+2 and GLn+3 are disposed to be spaced apart from each other by a predetermined distance. A distance between the first column insulating layer 120 and the first-neighboring column insulating layer 120 and a thickness of the first column insulating layer 120 are determined depending on the width and thickness of each of the gate lines GLn to GLn+3 and a process condition.

Here, the N-th and (N+1)th gate lines GLn and GLn+1 extend along both sidewalls of the first column insulating layer 120, and the (N+2)th and (N+3)th gate lines GLn+2 and GLn+3 extend along both sidewalls of the first-neighboring column insulating layer 120. Therefore, a width in the second direction D2 of the first column insulating layer 120 is equal to the first distance d1 between the N-th and (N+1)th gate lines GLn and GLn+1, and a width in the second direction D2 of the inter-insulating layer 125 is equal to the second distance d2 between the (N+2)th and (N+3)th gate lines GLn+2 and GLn+3.

Figure 3A:
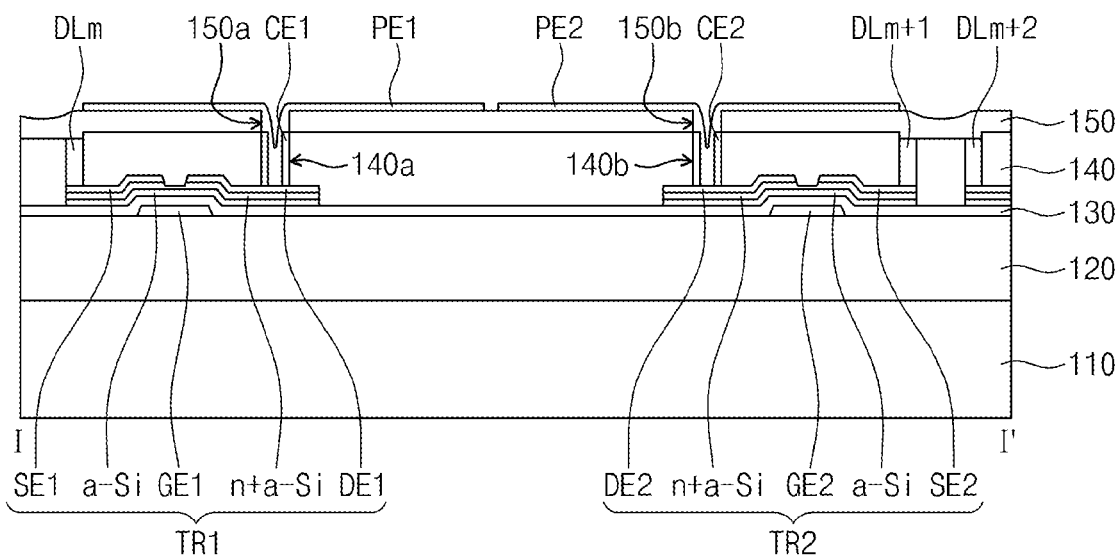
FIG. 3A is a cross-sectional view taken along a line I-I' shown in FIG. 2.
Figure 3B:
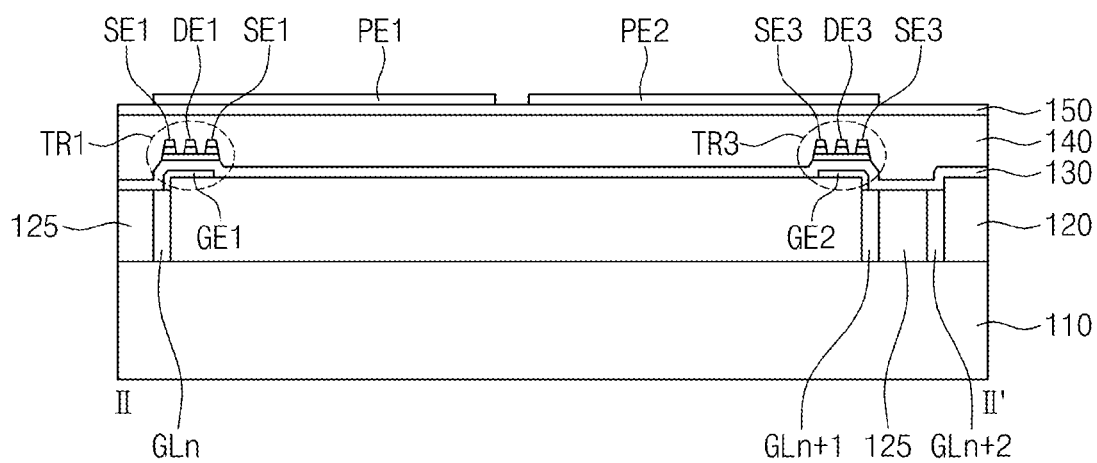
FIG. 3B is a cross-sectional view taken along a line II-IP shown in FIG. 2.

FIG. 3A is a cross-sectional view taken along a line I-I' shown in FIG. 2 and FIG. 3B is a cross-sectional view taken along a line II-IP shown in FIG. 2.

Referring to FIGS. 2, 3A, and 3B, the display panel 1000 further includes a plurality of gate electrodes GE1, GE2, GE3, and GE4 extending toward an upper surface of the first column insulating layer 120 from the N-th and (N+1)th gate lines GLn and GLn+1. The gate electrodes GE1 to GE4 are covered by a gate insulating layer 130 and an active layer is disposed on the gate insulating layer 130 to face the gate electrodes GE1 to GE4. The active layer is configured to include an amorphous silicon layer (a-si) and an n+ amorphous silicon layer (n+a-si). Source and drain electrodes SE1 to SE4 and DE1 to DE4 are disposed on the n+ amorphous silicon layer (n+a-si) and spaced apart from each other to correspond to one of the gate electrodes GE1 to GE4.

A second column insulating layer 140 is interposed between the M-th and (M+1)th data lines DLm and DLm+1 and between the (M+2) and (M+3)th data lines DLm+2 and DLm+3. The second column insulating layer 140 interposed between the M-th and (M+1)th data lines DLm and DLm+1 and the second column insulating layer 140 (hereinafter, referred to as second-neighboring column insulating layer) between the (M+2) and (M+3)th data lines DLm+2 and DLm+3 are spaced apart from each other by a predetermined distance. A distance between the second column insulating layer 140 and the second-neighboring column insulating layer 140 and a thickness of the second column insulating layer 140 are determined depending on the width and thickness of each of the data lines DLm to DLm+3 and a process condition.

Figure 18A:
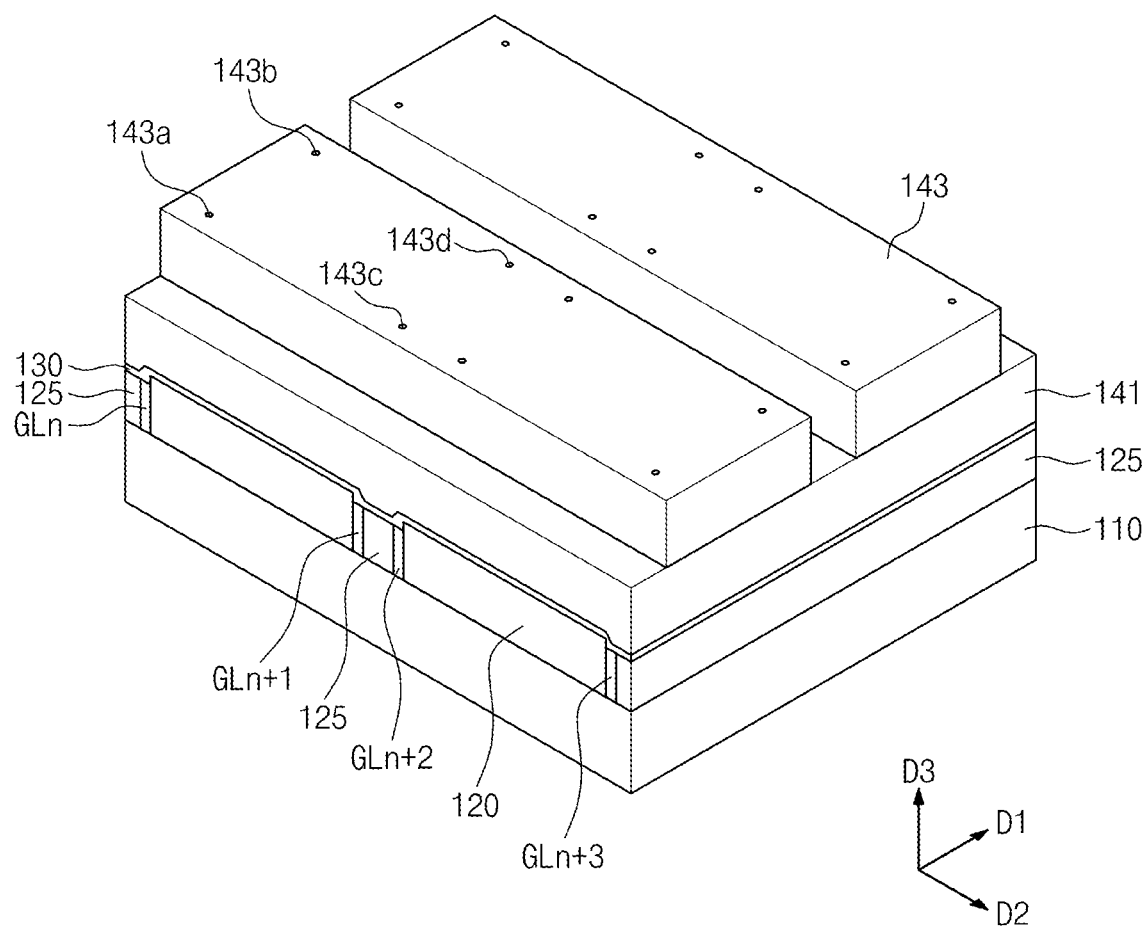
Figure 19A:
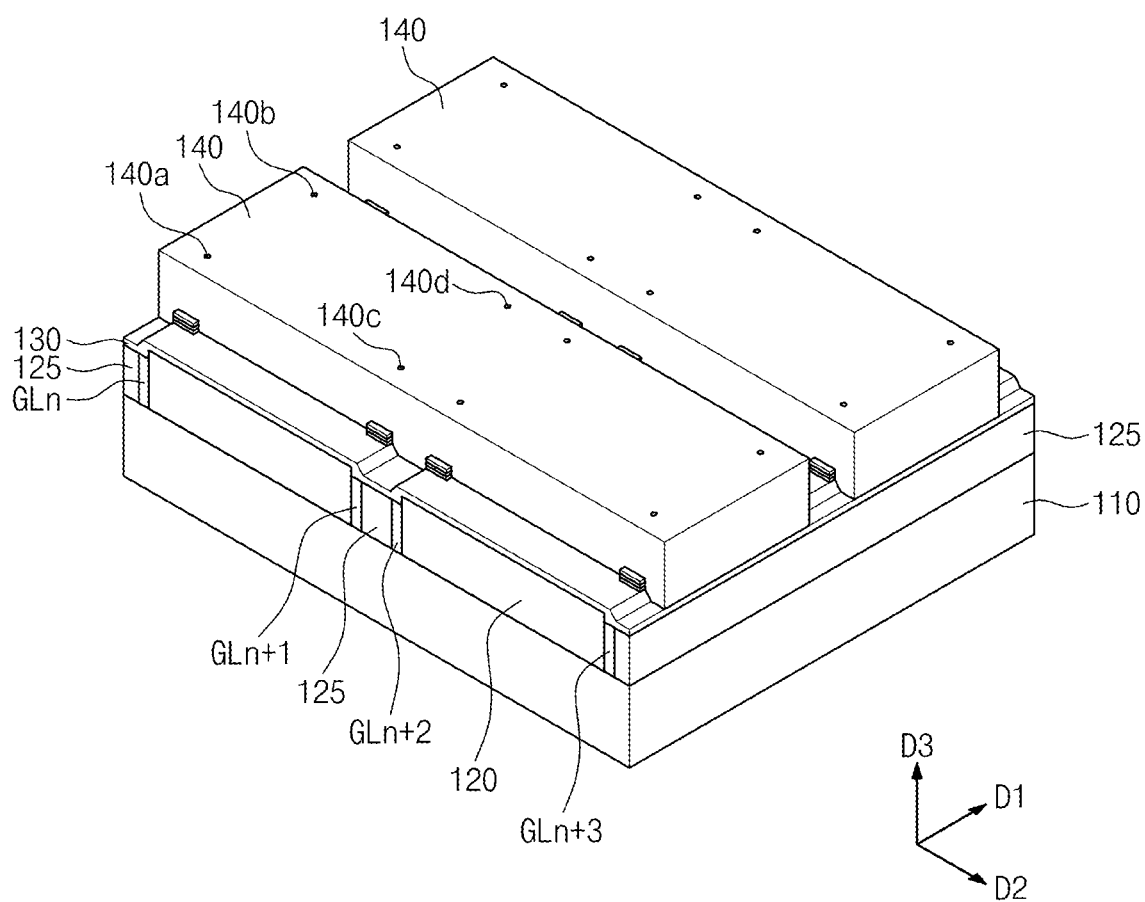
Figure 19B:
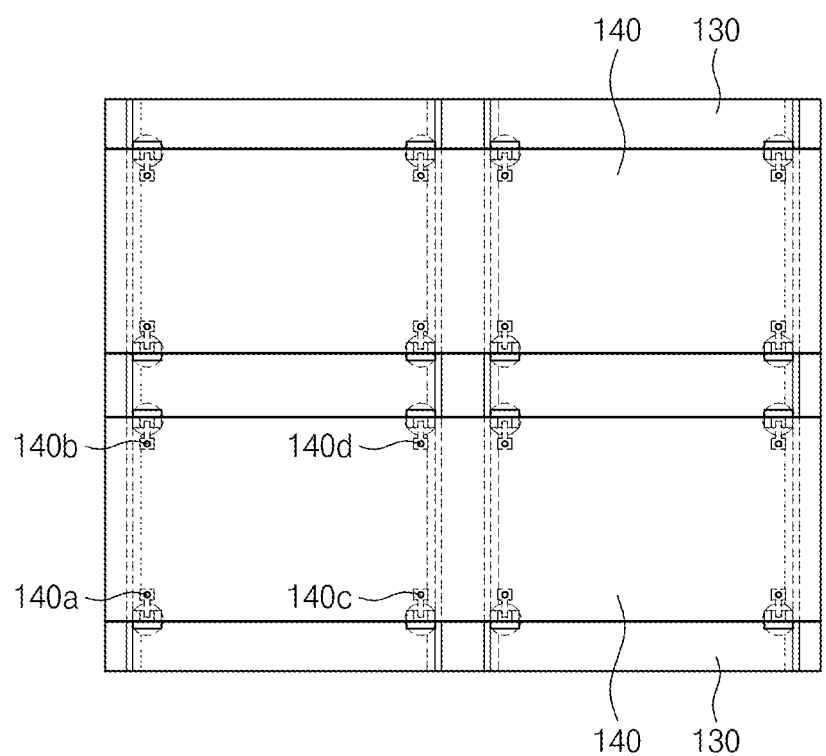

Referring to FIG. 3B, FIG. 18A and FIG. 19B, the source electrodes SE1 to SE4 are disposed to partially overlap with the second column insulating layer 140. Thus, a portion of the source electrodes SE1 to SE4 may be exposed without being covered by the second column insulating layer 140. The M-th and (M+1)th data lines DLm and DLm+1 extend along both sidewalls of the second column insulating layer 140, and the (M+2)th and (M+3)th data lines DLm+2 and DLm+3 extend along both sidewalls of the second-neighboring column insulating layer 140. Accordingly, each of the data lines DLm to DLm+3 makes direct contact with the exposed portion of a corresponding source electrode of the source electrodes SE1 to SE4 and is electrically connected to the exposed portion of a corresponding source electrode of the source electrodes SE1 to SE4. When viewed in a plan view, the source electrode SE1 to SE4 are partially overlapped with the corresponding data lines DLm to DLm+3.

As an example, a width in the first direction D1 of each of the second column insulating layers 140 may be equal to the third distance d3. In addition, the second column insulating layer 140 is provided with first contact holes 140a, 140b, 140c, and 140d formed therethrough to partially expose the drain electrodes DE1 to DE4. Further, contact electrodes CE1, CE2, CE3, and CE4 are respectively disposed in the first contact holes 140a, 140b, 140c, and 140d, which are formed along inner sidewalls of the second column insulating layer 140 that defines the first contact holes 140a, 140b, 140c, and 140d. The contact electrodes CE1 to CE4 may have a cylindrical shape to fill the first contact holes 140a, 140b, 140c, and 140d or a pipe shape extending along the inner sidewalls of the second column insulating layer 140 that defines the first contact holes 140a, 140b, 140c, and 140d.

The data lines DLm to DLm+3 are covered by a protective layer 150. The protective layer 150 includes second contact holes 150a to 150d formed at positions corresponding to the first contact holes 140a, 140b, 140c, and 140d, respectively. Thus, the contact electrodes CE1 to CE4 may be exposed through the second contact holes 150a to 150d.

The first to fourth pixel electrodes PE1 to PE4 are disposed on the protective layer 150 and the first to fourth pixel electrodes PE1 to PE4 make direct contact with the contact electrodes CE1 to CE4 exposed through the second contact holes 150a to 150d. Accordingly, the first to fourth pixel electrodes PE1 to PE4 may be electrically connected to the first to fourth drain electrodes DE1 to DE4, respectively, via the contact electrodes CE1 to CE4.

Although not shown in figures, the display panel 1000 may further include an opposite substrate facing the base substrate 110, and the opposite substrate may include an opposite electrode facing the pixel electrodes. A light control layer may be disposed between the base substrate 110 and the opposite substrate to control a transmittance of light from an external source (not shown). As an example, the light control layer may be a liquid crystal layer or an organic light emitting layer.

Hereinafter, a manufacturing process of the display panel 1000 will be described in detail with reference to figures.

FIGS. 4A to 25A and 4B to 25B are cross-sectional views showing a manufacturing method of the display panel shown in FIG. 1.

Figure 4A:
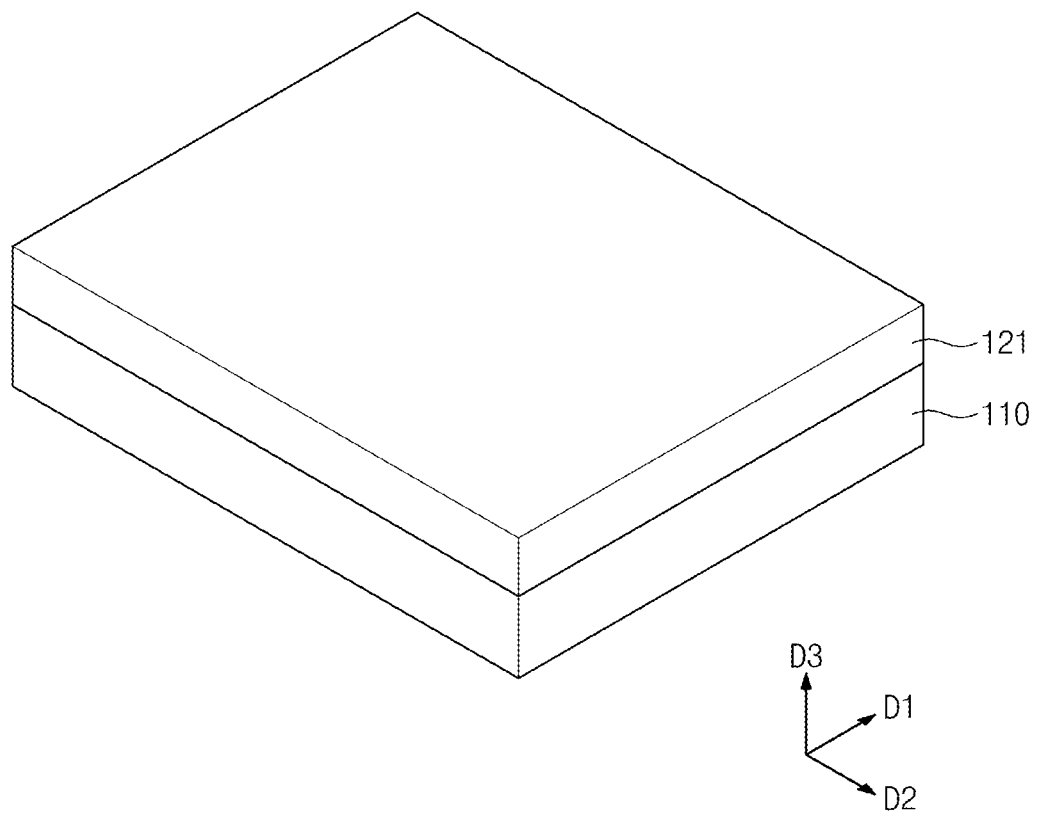
Figure 4B:
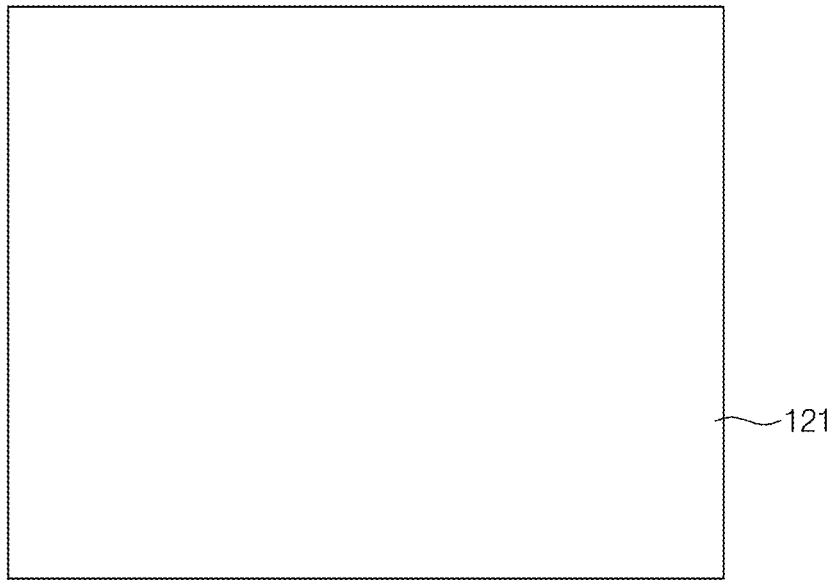

Referring to FIGS. 4A and 4B, a first insulating material 121 is formed on the base substrate 110. The first insulating material 121 has a thickness determined by taking the thickness of gate lines GLn to GLn+3 into considerations. In addition, the first insulating material 121 includes a material with high transmittance, such as silicon nitride (SiNx), silicon oxycarbide (SiOC), or polymer-based organic material.

Figure 5A:
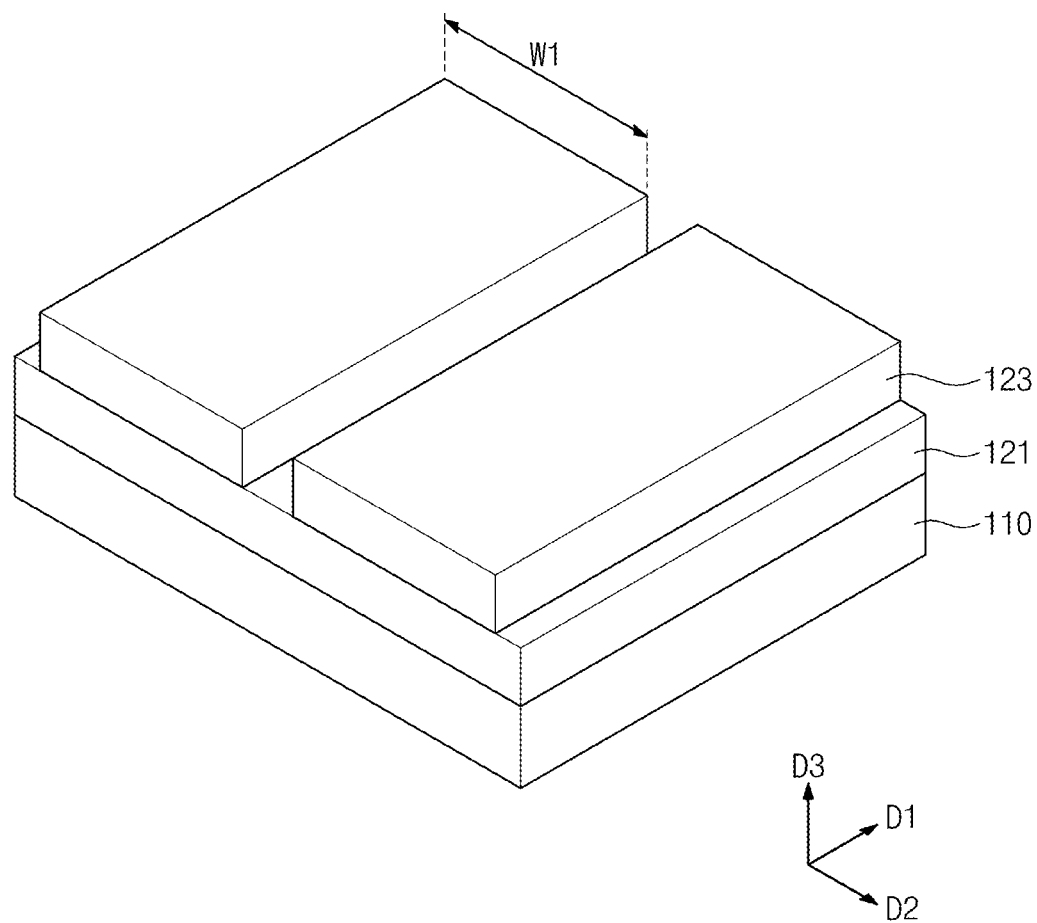
Figure 5B:
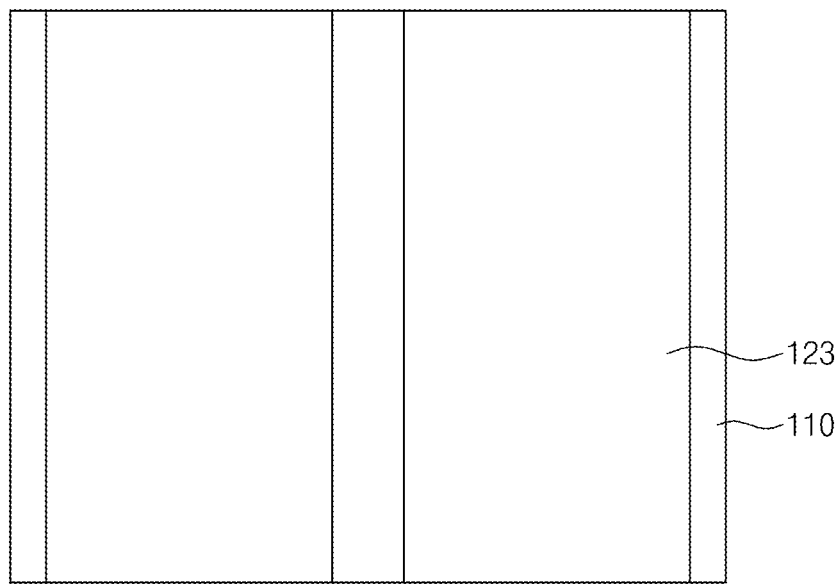

Referring to FIGS. 5A and 5B, a first photoresist pattern 123 is formed on the first insulating material 121. The first photoresist pattern 123 has a first width w1 in the second direction D2 and is spaced apart from another first photoresist pattern 123 adjacent thereto in the second direction D2. That is, the first photoresist patterns 123 extend in the first direction D1 and are arranged in the second direction D2 to be spaced apart from each other by a predetermined distance.

Figure 6A:
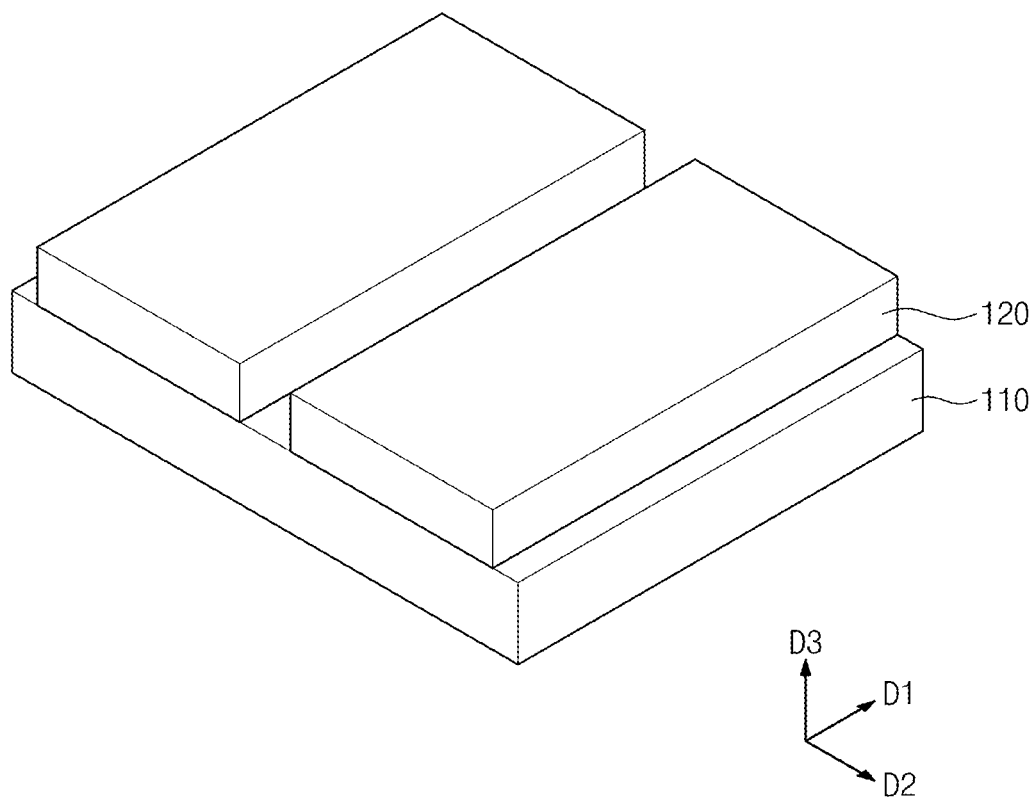
Figure 6B:
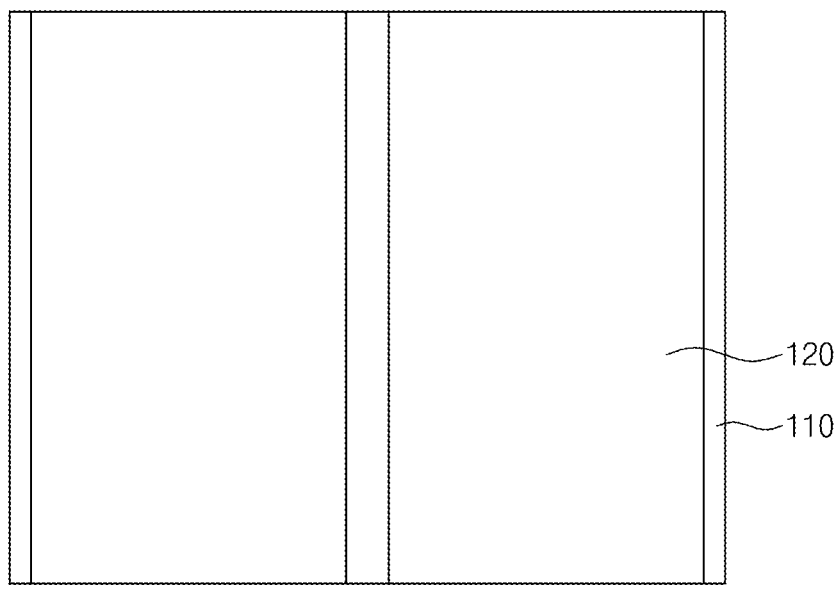

When the first insulating material 121 is etched using the first photoresist pattern 123 as a mask, the first column insulating layer 120 having the shape corresponding to the first photoresist pattern 123 is formed as shown in FIGS. 6A and 6B. Then, the first photoresist pattern 123 on the first column insulating layer 120 is removed.

Figure 7A:
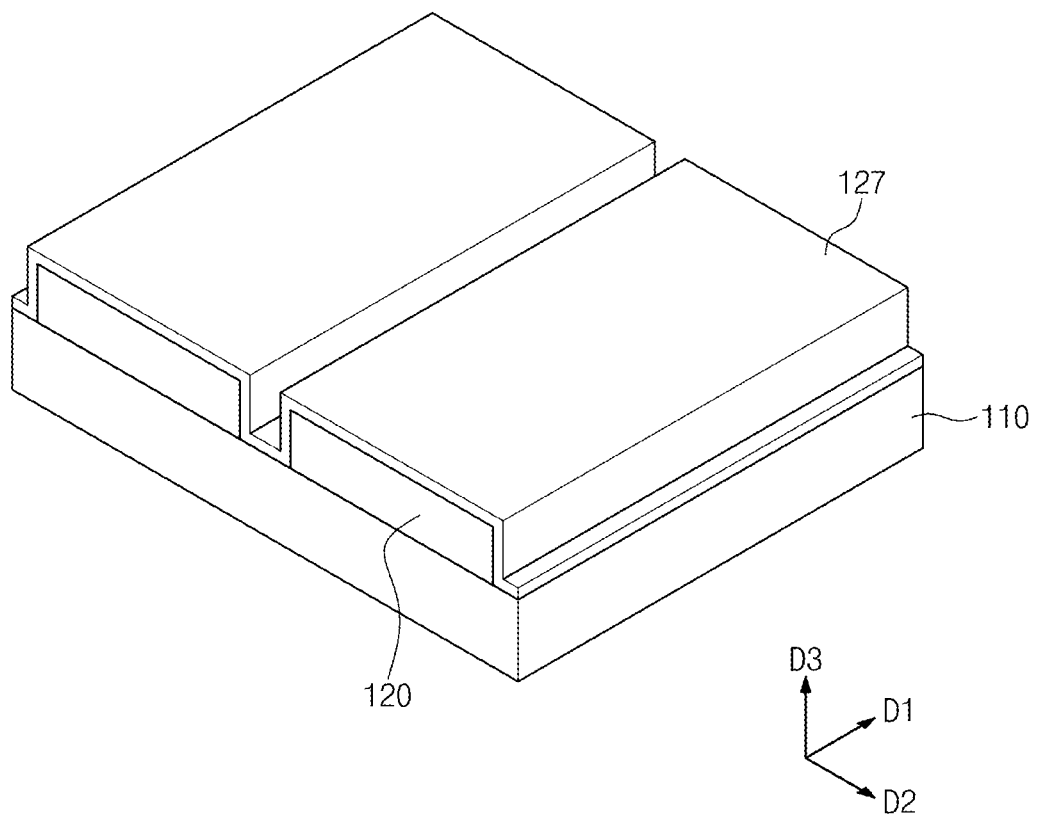
Figure 7B:
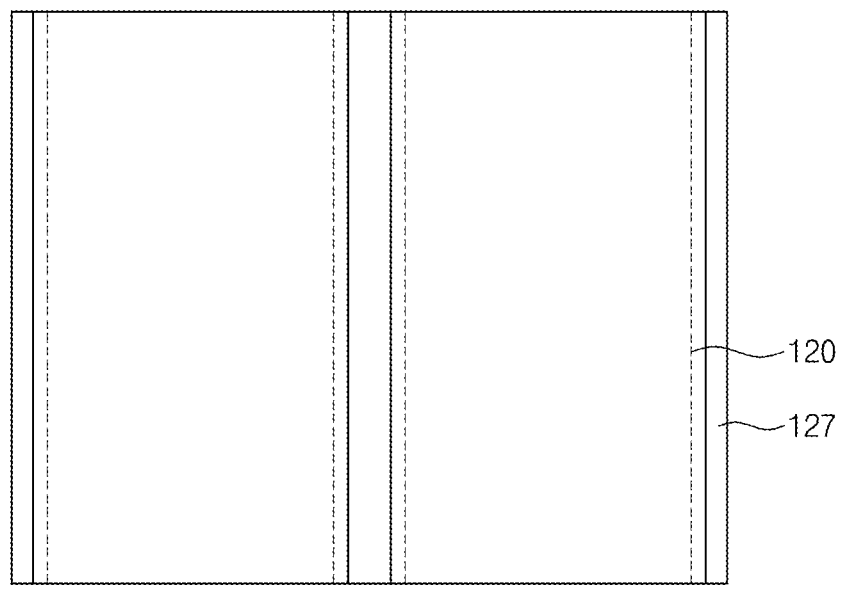

Referring to FIGS. 7A and 7B, a gate-line material 127 is formed on the first column insulating layer 120 and the base substrate 110. The gate-line material 127 has a thickness determined by taking a channel length, the width in the second direction D2 of the gate lines GLn to GLn+3, into consideration.

Then, the gate-line material 127 disposed on the first column insulating layer 120 is anisotropically etched. As an example, the anisotropic etching process is performed in a direction substantially vertical to the surface of the base substrate 110. Therefore, a portion of the gate-line material, which is substantially in parallel to the surface of the base substrate 110, is removed by the anisotropic etching process and a portion of the gate-line material, which is substantially vertical to the surface of the base substrate 110, is not removed by the anisotropic etching process.

Figure 8A:
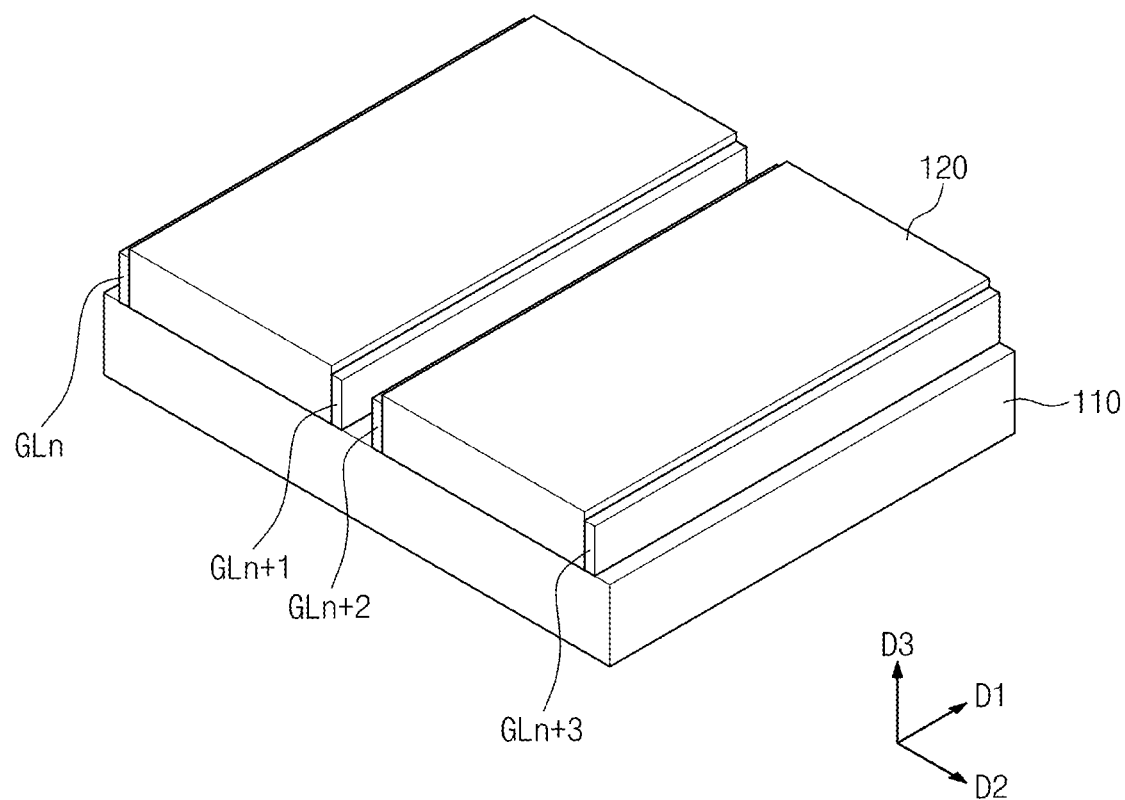
Figure 8B:
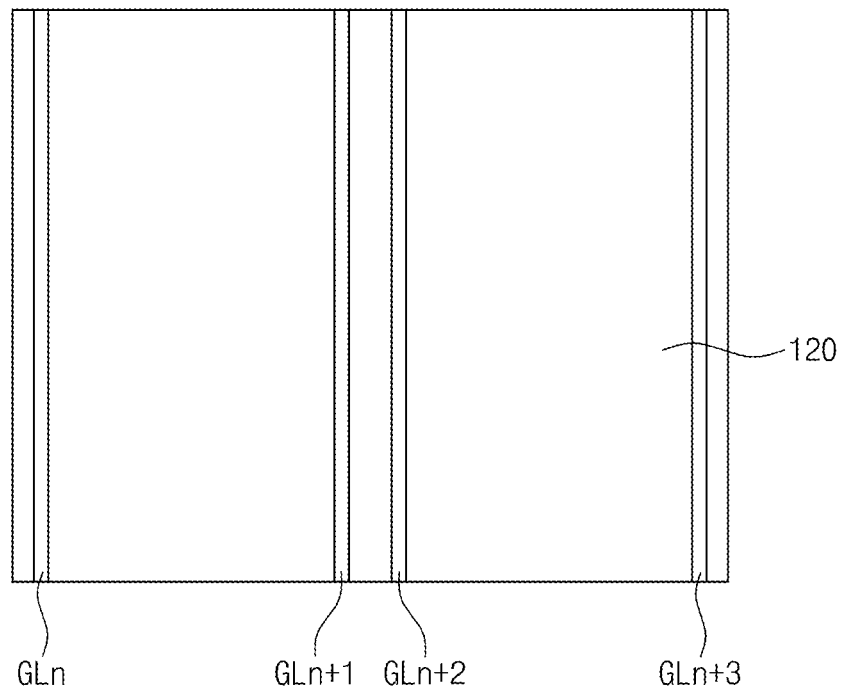

Thus, when the gate-line material 127 is anisotropically etched, the gate lines GLn to GLn+3 are formed along the sidewalls of the first column insulating layer 120 as shown in FIGS. 8A and 8B. The width of the gate lines GLn to GLn+3 may be substantially identical to the thickness of the gate-line material 127 disposed on the first column insulating layer 120.

To prevent the vertical portion of the gate-line material 127 disposed at the sidewalls of the first column insulating layer 120 from being etched, it is important to control an inclination angle of the sidewalls of the first column insulating layer 120. That is, when assuming that the inclination angle of the sidewalls of the first column insulating layer 120 is "θ1", the inclination angle θ1 may exist in a range of about 85 degrees to about 95 degrees. The inclination angle θ1 of the sidewalls preferably has an angle of about 90 degrees, but it is difficult to allow the inclination angle θ1 of the sidewalls to have the angle of about 90 degrees as the thickness of the first column insulating layer 120 becomes thicker.

Therefore, although not shown in figures, before the first photoresist pattern 123 is formed on the first insulating material 121, a hard-mask material may be formed on the first insulating material 121 and the first photoresist pattern 123 may be formed on the hard-mask material. In this case, the hard-mask material has a thickness thinner than that of the first photoresist pattern 123 and includes a metal material, such as aluminum. When the hard-mask material is etched using the first photoresist pattern 123 as a mask to form a hard mask pattern and the first insulating material 121 is etched using the hard mask pattern as a mask, the sidewalls of the first column insulating layer 120 may have the inclination angle θ1 closer to the angle of about 90 degrees.

Meanwhile, according to another embodiment, each of the gate lines GLn to GLn+1 may have a multi-layer structure rather than a single-layer structure. FIGS. 26A to 26D are cross-sectional view showing a manufacturing method of a gate line according to another exemplary embodiment of the present disclosure. FIGS. 26A to 26D show a manufacturing process of the gate lines GLn to GLn+1 each having a double-layer structure.

Figure 26A:
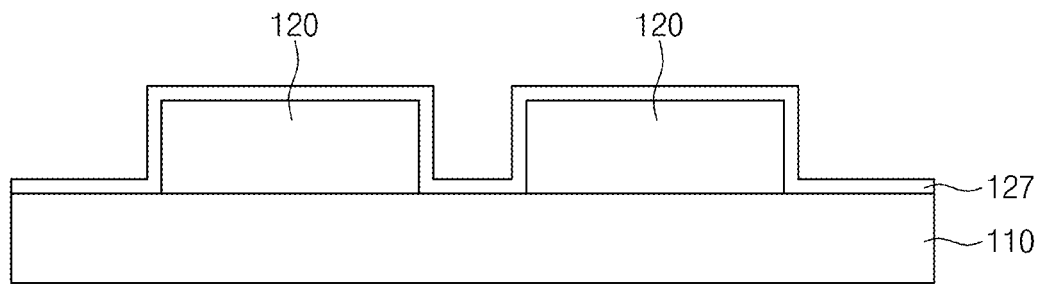
FIGS. 26A to 26D are cross-sectional view showing a manufacturing method of an electrode structure according to another exemplary embodiment of the present disclosure.
Figure 26B:
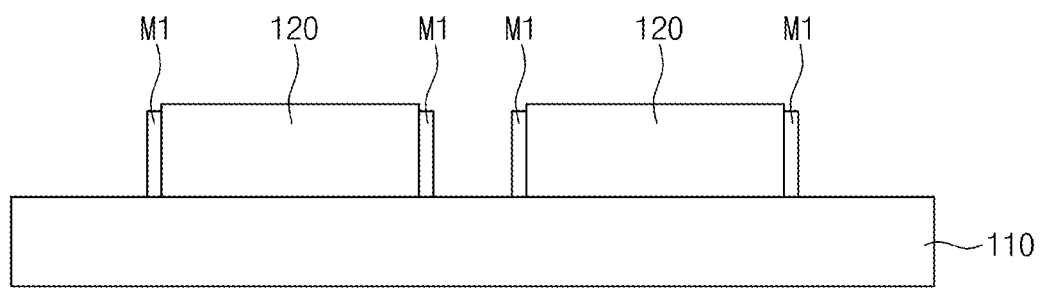

Referring to FIG. 26A, a first gate-line material 127 is formed on the base substrate 110 and the first column insulating layer 120. When the first gate-line material 127 is anisotropically etched, a first electrode layer M1 of the gate lines GLn to GLn+1 is formed along the sidewalls of the first column insulating layer 120 as shown in FIG. 26B.

Figure 26C:
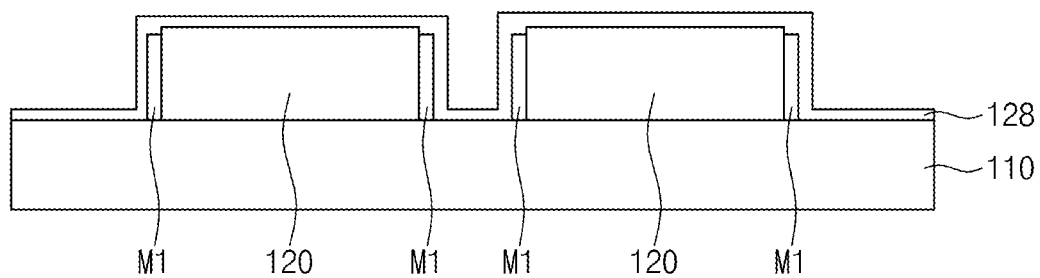

Referring to FIG. 26C, a second gate-line material 128 is formed on the base substrate 110, the first electrode layer M1, and the first column insulating layer 120. The second gate-line material 128 may include a metal material different from that of the first gate-line material 127.

Figure 26D:
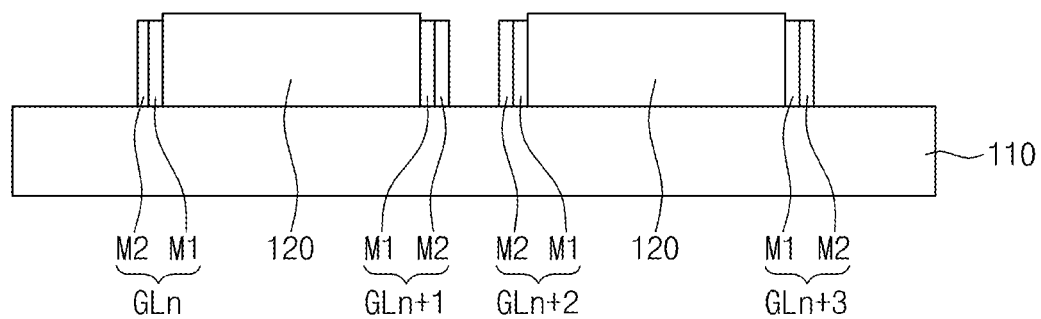

When the second gate-line material 128 is anisotropically etched again, a second electrode layer M2 is formed on the first electrode layer M1 along the sidewalls of the first column insulating layer 120 as shown in FIG. 26D. Thus, the gate lines GLn to GLn+3, each having the double-layer structure, are formed along the sidewalls of the first column insulating layer 120.

FIGS. 26A to 26D show the manufacturing process of the gate lines GLn to GLn+3 each having the double-layer structure, but gate lines GLn to GLn+3, each having a triple-layer structure, may be formed by repeatedly performing the above-mentioned processes.

The manufacturing process of the gate lines GLn to GLn+3 each having a multi-layer structure may be performed by sequentially forming a multi-layer gate line materials on the base substrate 110n and the first column insulating layer 120 and performing in-situ anisotropic etching of the multi-layer gate line materials one after another without a mask.

However, the vertical portion of the first gate-line material 127 may be partially etched even though the anisotropic etching process is performed. Accordingly, a method of preventing the vertical portion from being etched will be suggested as another exemplary embodiment.

Figure 27A:
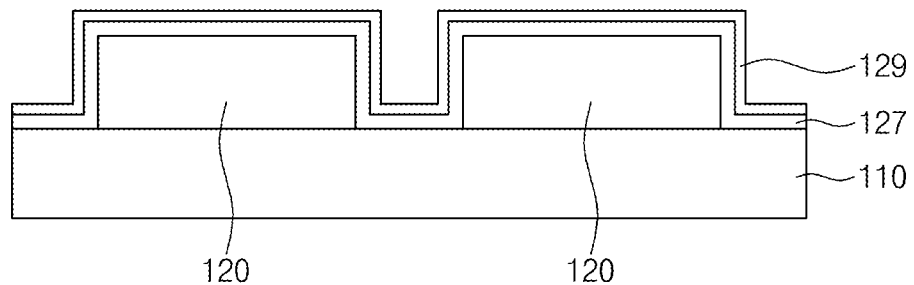
FIGS. 27A to 27C are cross-sectional view showing a manufacturing method of an electrode structure according to another exemplary embodiment of the present disclosure.
Figure 27B:
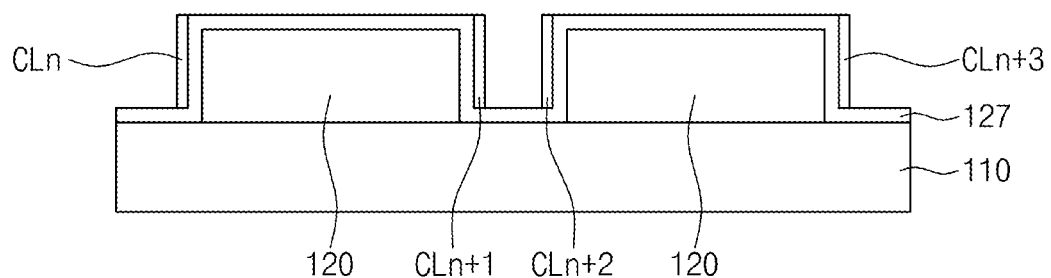
Figure 27C:
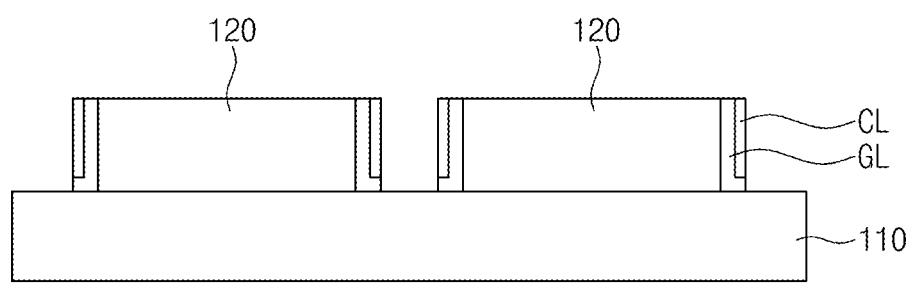

FIGS. 27A to 27C are cross-sectional view showing a manufacturing method of a gate line according to another exemplary embodiment of the present disclosure.

Referring to FIG. 27A, a gate-line material 127 and a capping material 129 are sequentially formed on the first base substrate 110 and the first column insulating layer 120. The capping material 129 may include a material having different etch selectivity from that of the gate-line material 127. For instance, the capping material 129 may be silicon oxide.

When the capping material 129 is anisotropically etched, capping layers CLn, CLn+1, CLn+2, and CLn+3 are formed on the gate-line material 127 along the sidewalls of the first column insulating layer 120 as shown in FIG. 27B. That is, the capping layers CLn to CLn+3 are removed from the horizontal portion of the gate-line material 127 and formed only in the vertical portion of the gate-line material 127.

Then, when the gate-line material is anisotropically etched, the horizontal portion of the gate-line material 127 disposed on the first column insulating layer 120 is etched and the vertical portion of the gate-line material 127 covered by the capping layers CLn to CLn+3 is not etched as shown in FIG. 27C. Therefore, each of the gate lines GLn to GLn+3 may be formed between a corresponding capping layer CLn to CLn+3 and the sidewall of the first column insulating layer 120 and the vertical portion of the gate-line material 127 may be prevented from being etched by the capping layers CLn to CLn+3, and thus the gate lines GLn to GLn+3 may have the desired thickness.

Figure 9A:
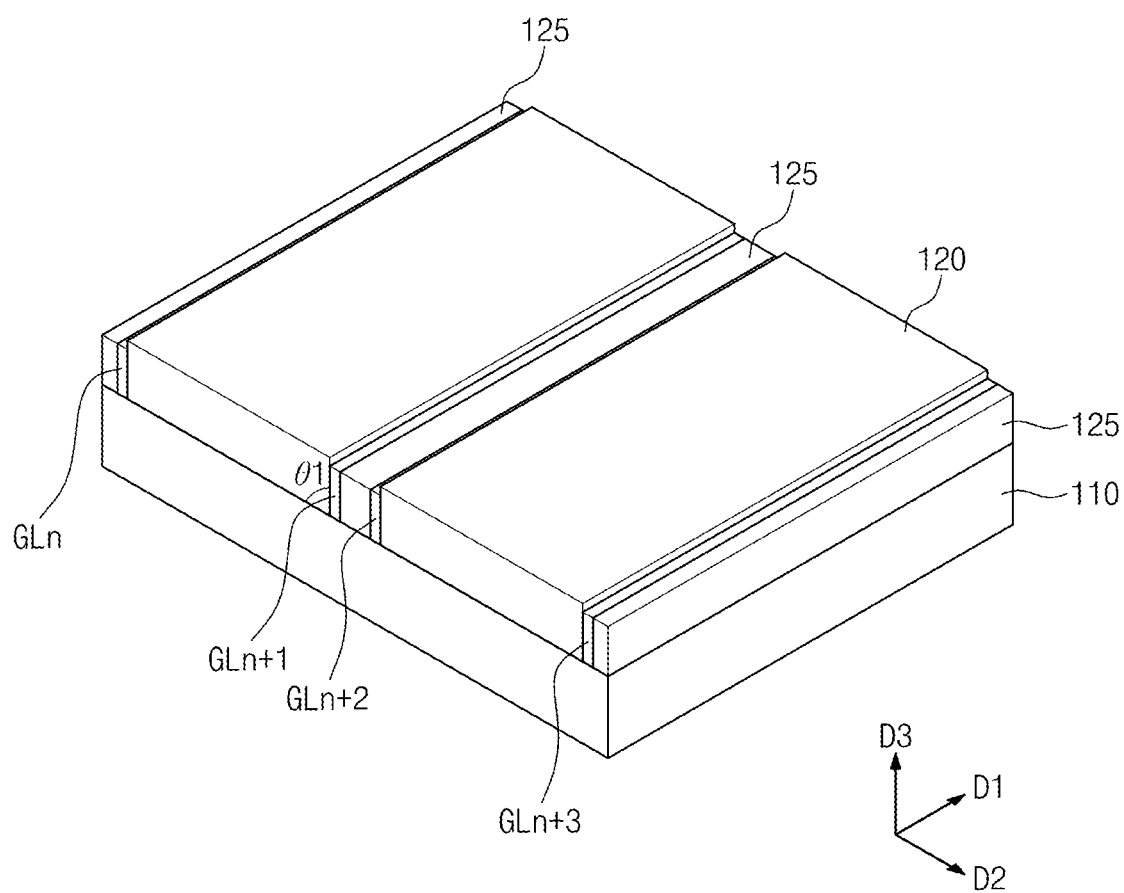
Figure 9B:
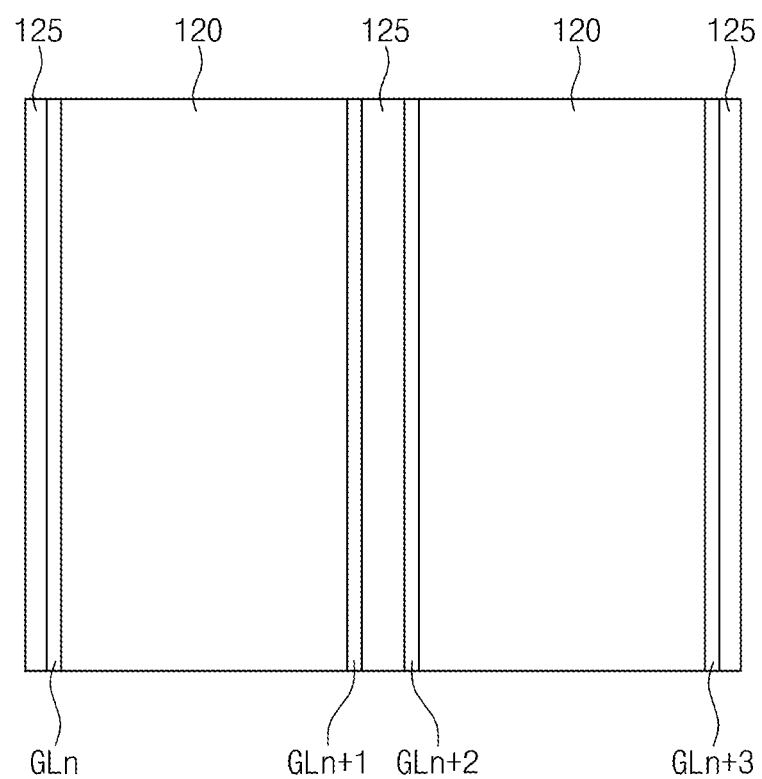

Referring to FIGS. 9A and 9B, the inter-insulating layer 125 is formed between the (N+1)th gate line GLn+1 formed on the sidewalls of the first column insulating layer 120 and the (N+2)th gate line GLn+2 formed on the sidewalls of the first-neighboring column insulating layer 120.

The inter-insulating layer 125 electrically insulates two adjacent gate lines GLn+1 and GLn+2 from each other. As an example, the inter-insulating layer 125 may be formed by a coating or depositing method. In addition, the inter-insulating layer 125 does not cover the upper surface of the gate lines GLn+1 and GLn+2. In a case that the inter-insulating layer 125 covers the upper surface of the gate lines GLn+1 and GLn+2 after the coating or depositing process, the inter-insulating layer 125 disposed on the upper surface of the gate lines GLn+1 and GLn+2 may be removed by an etching process such as anisotropic etching and chemical mechanical polishing.

Figure 10A:
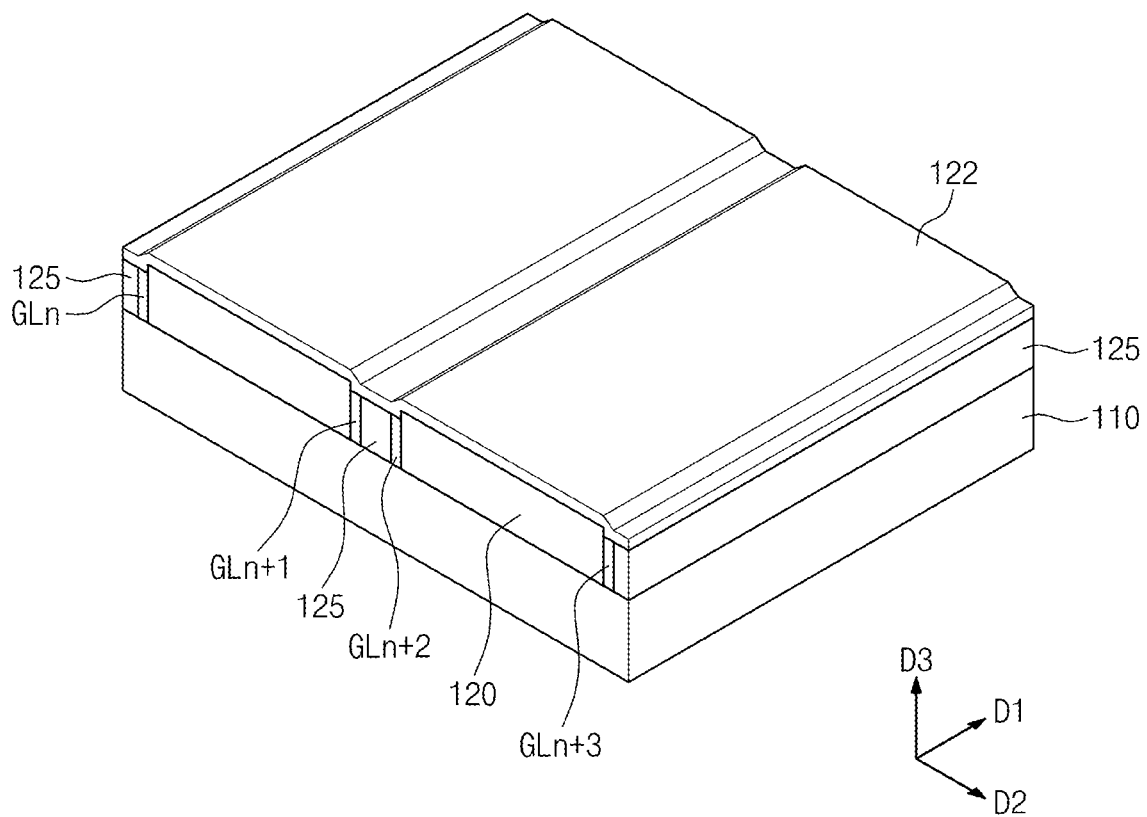
Figure 10B:
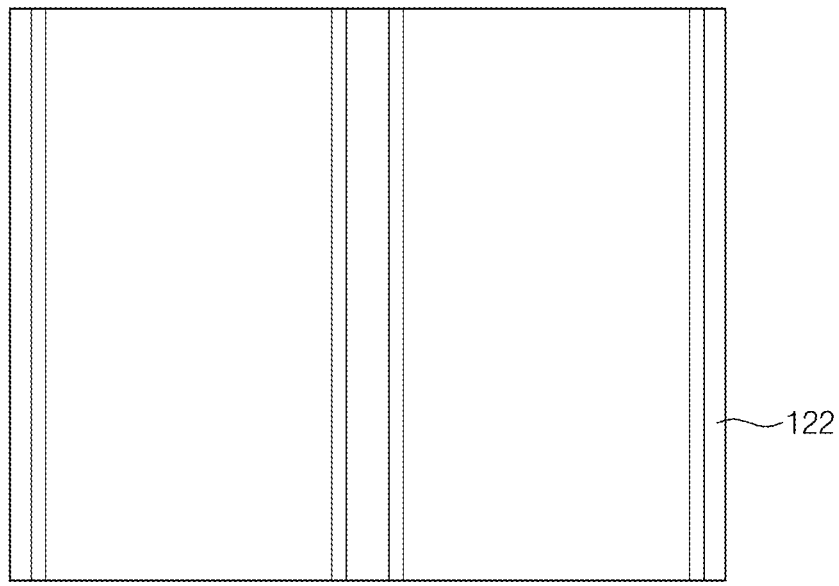

Referring to FIGS. 10A and 10B, a gate-electrode material 122 is formed on the first column insulating layer 120, the gate lines GLn to GLn+3, and the inter-insulating layer 125. The gate-electrode material 122 may include the same material as the gate-line material 121 used to form the gate lines GLn to GLn+3.

Figure 11A:
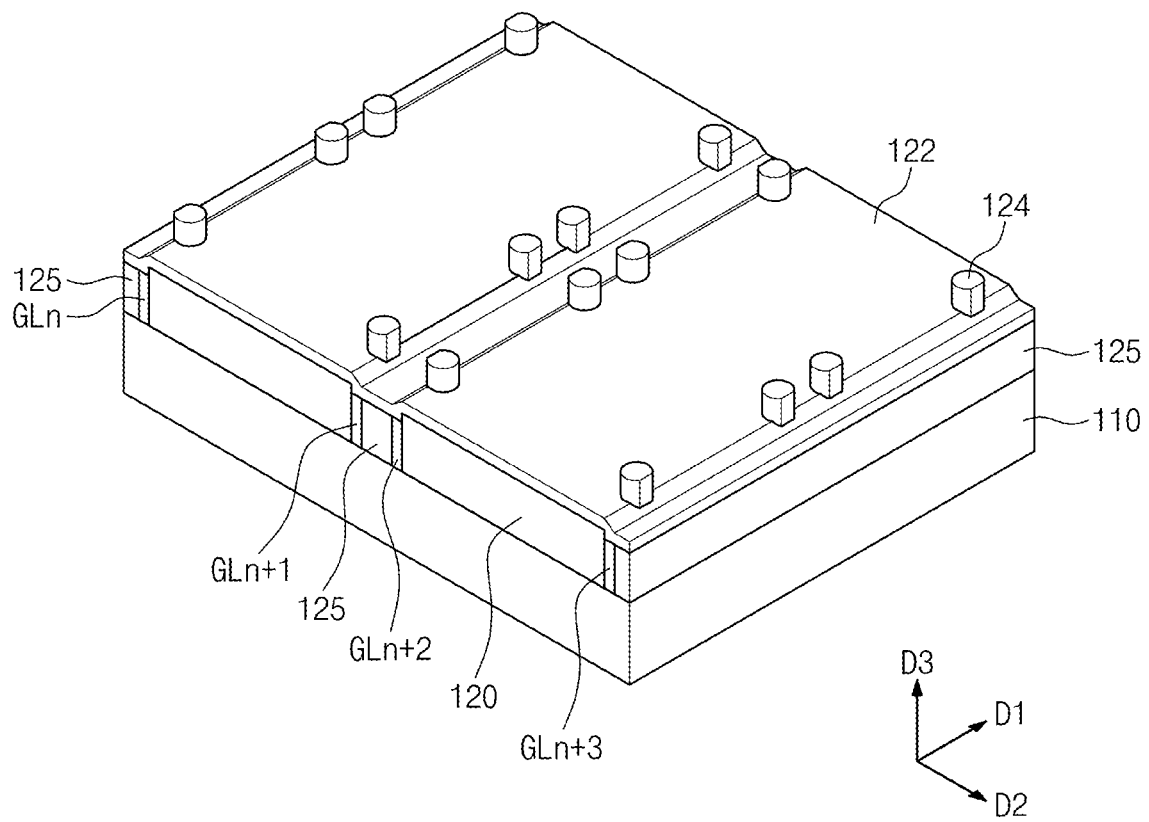
Figure 11B:
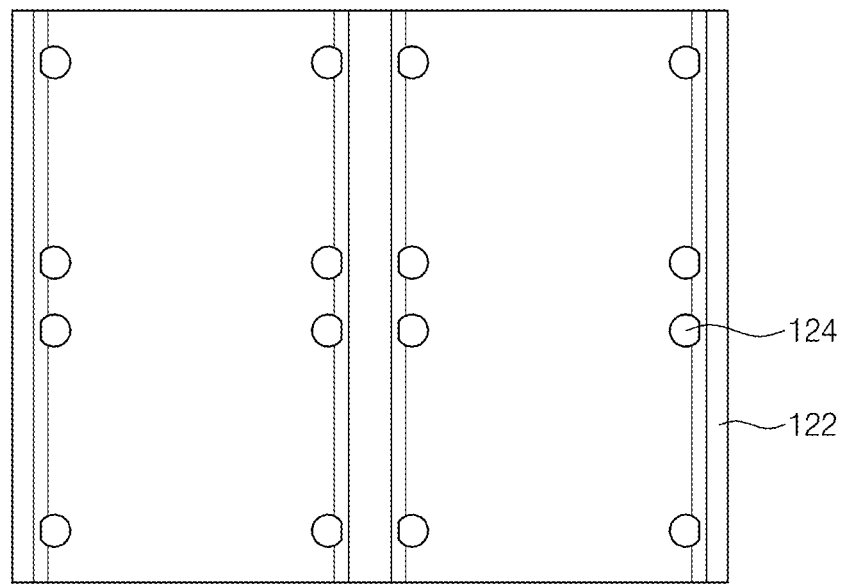

Referring to FIGS. 11A and 11B, a second photoresist pattern 124 is formed on the gate-electrode material 122.

Figure 12A:
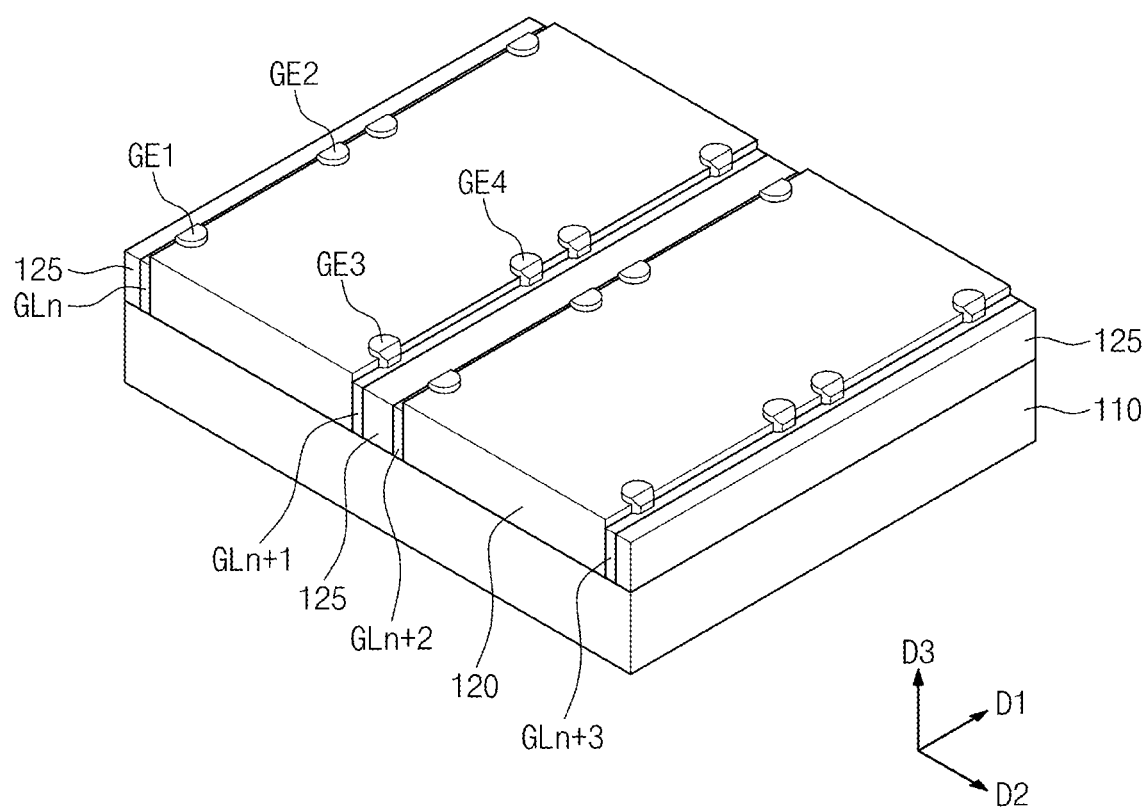
Figure 12B:
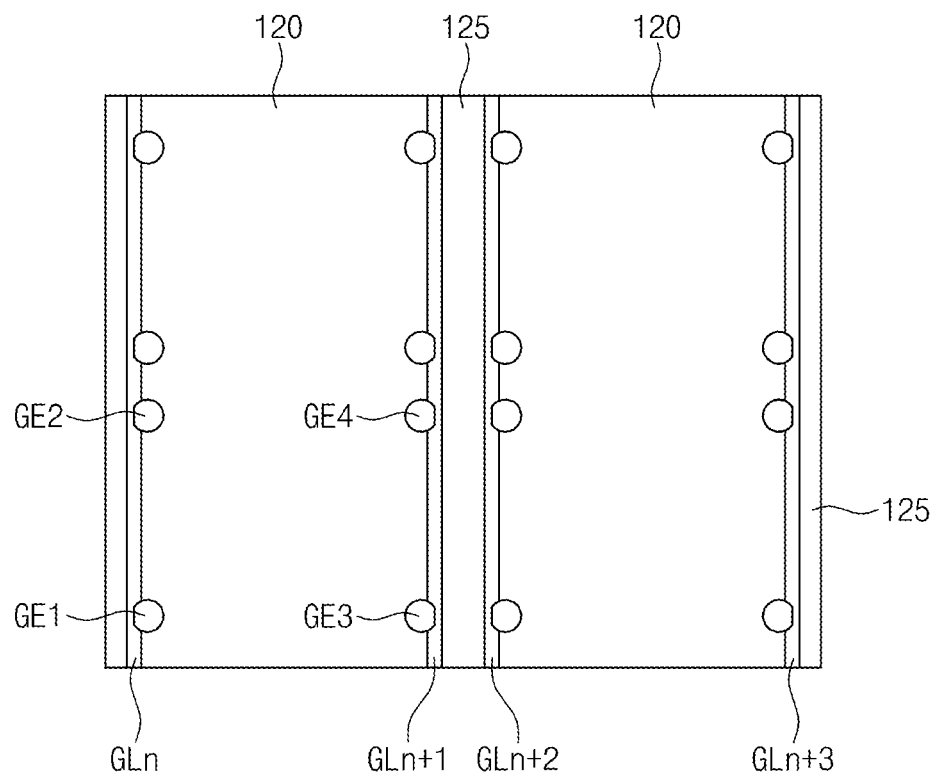

When the gate-electrode material 122 is etched using the second photoresist pattern 124 as a mask, the gate electrodes GE1 to GE4 are formed as shown in FIGS. 12A and 12B. Then, the second photoresist pattern 124 is removed. The gate electrodes GE1 to GE4 are electrically connected to the corresponding gate lines GLn to GLn+3 and extend toward the upper surface of the first column insulating layer 120. As shown in FIG. 12B, the gate electrodes GE1 to GE4 may partially overlap the corresponding gate lines GLn to GLn+3 in a width direction of the gate lines when viewed in a plan view.

FIGS. 10A to 12A and 10B to 12B show the gate electrodes GE1 to GE4 each having a single-layer structure, but each of the gate electrodes GE1 to GE4 may have a multi-layer structure. When the gate electrodes GE1 to GE4 have the single-layer structure and the gate lines GLn to GLn+3 have the multi-layer structure, the gate electrodes GE1 to GE4 may include one of materials used to form the gate lines GLn to GLn+3.

Figure 13A:
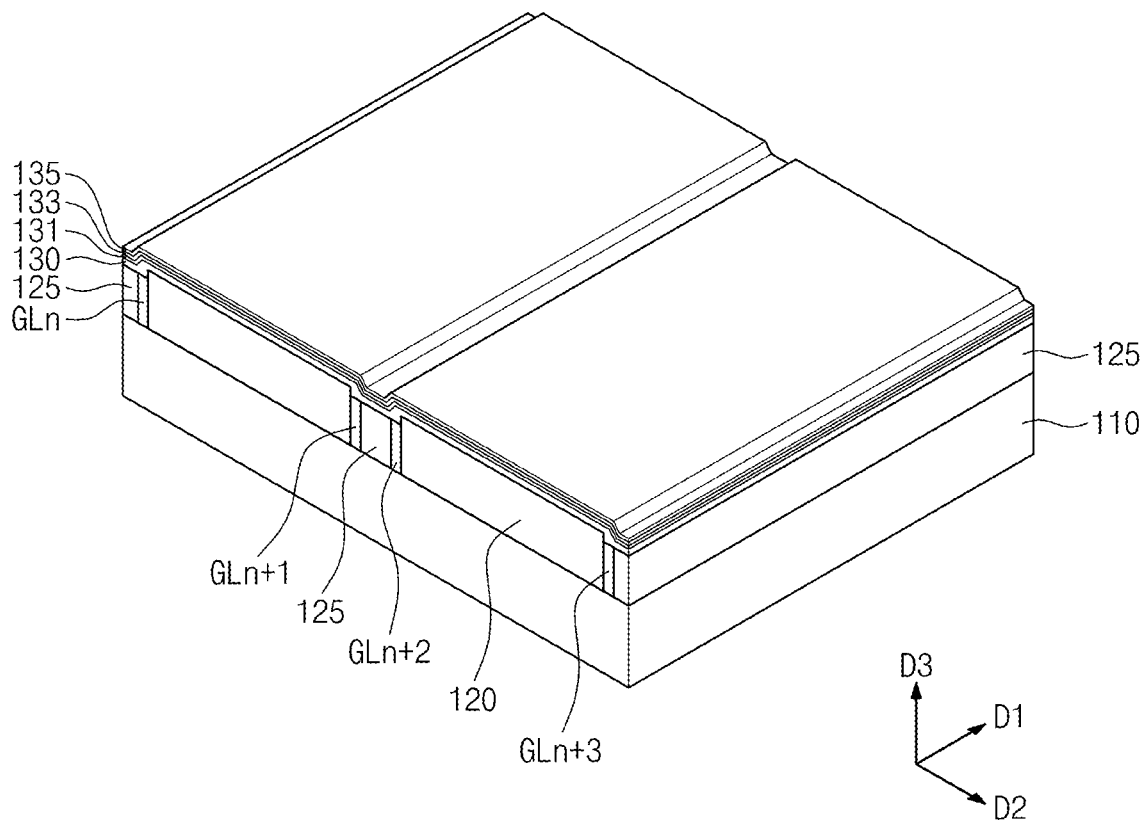
Figure 13B:
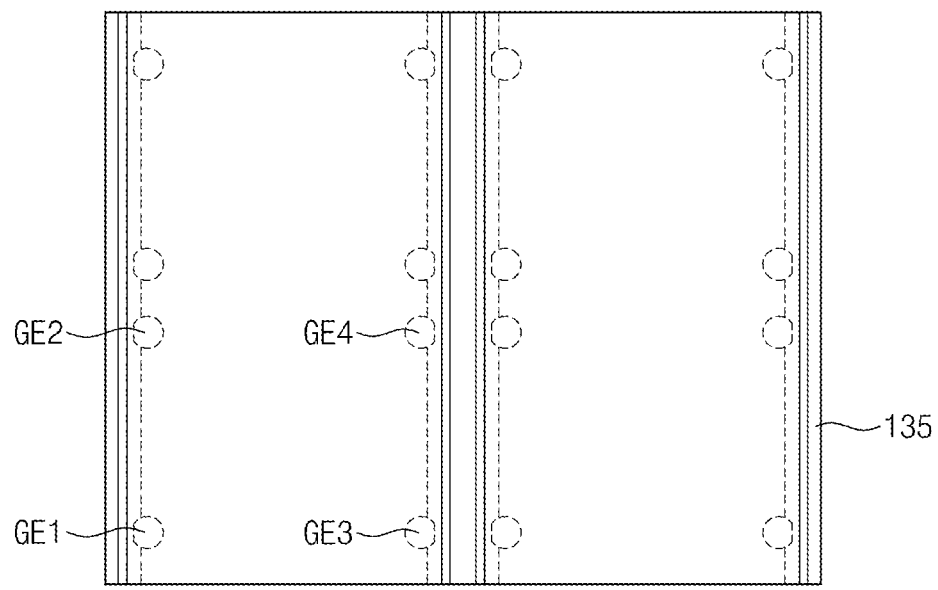

Referring to FIGS. 13A and 13B, the gate insulating layer 130 is formed on the first column insulating layer 120, the gate lines GLn to GLn+3, the inter-insulating layer 125, and the gate electrodes GE1 to GE4, and the amorphous silicon layer 131, the n+ amorphous silicon layer 133, and a source/drain electrode material 135 are sequentially formed on the gate insulating layer 130.

Figure 14A:
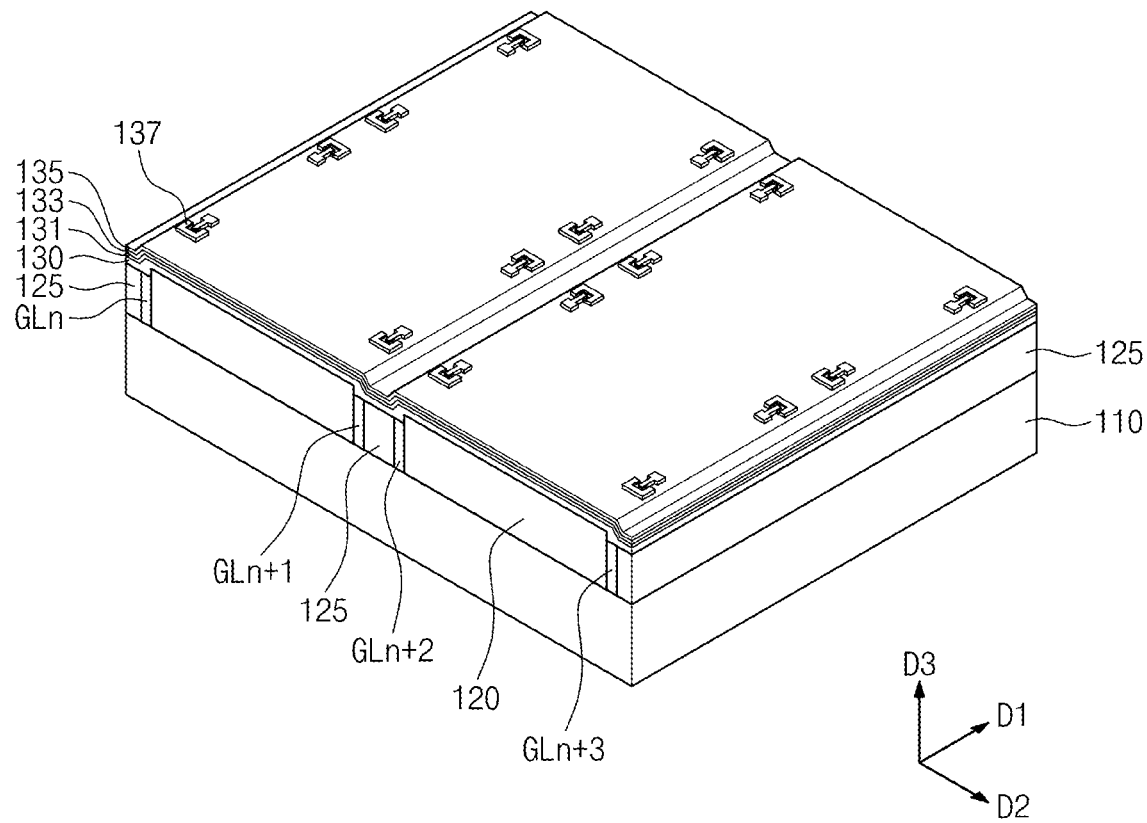
Figure 14B:
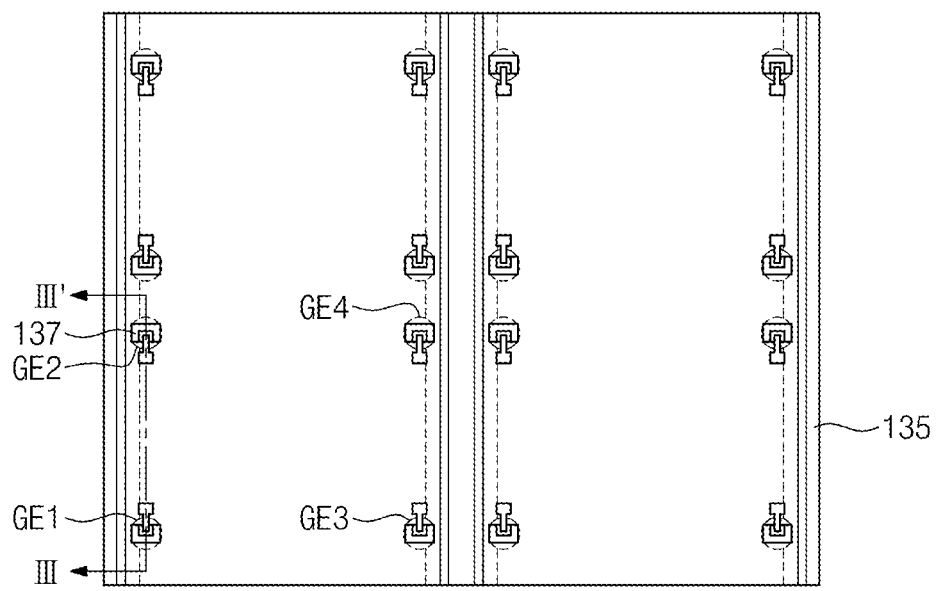
Figure 14C:
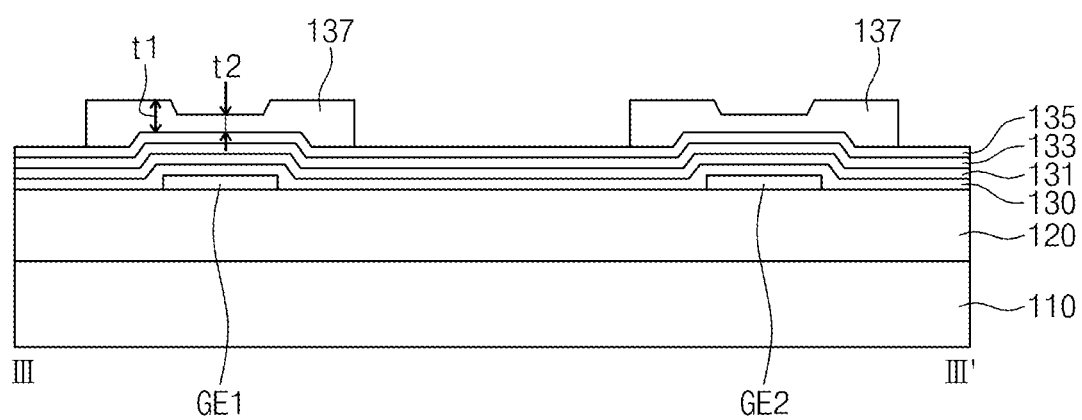

Referring to FIGS. 14A, 14B, and 14C, a third photoresist pattern 137 is formed on the source/drain electrode material 135. The third photoresist pattern 137 has a first thickness t1 in a region in which the source electrodes SE1 to SE4 and the drain electrodes DE1 to DE4 are formed and a second thickness t2 thinner than the first thickness t1 in a region, i.e., a channel region, between the source electrodes SE1 to SE4 and the drain electrodes DE1 to DE4.

Figure 15A:
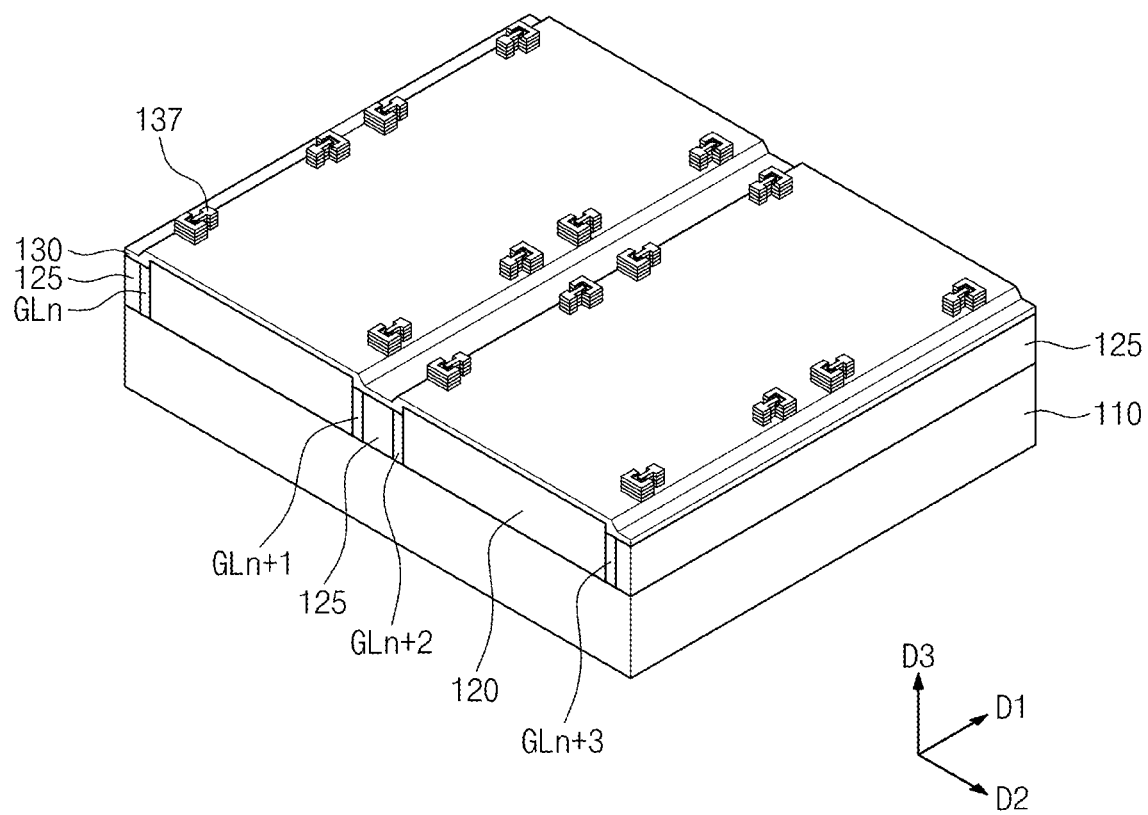
Figure 15B:
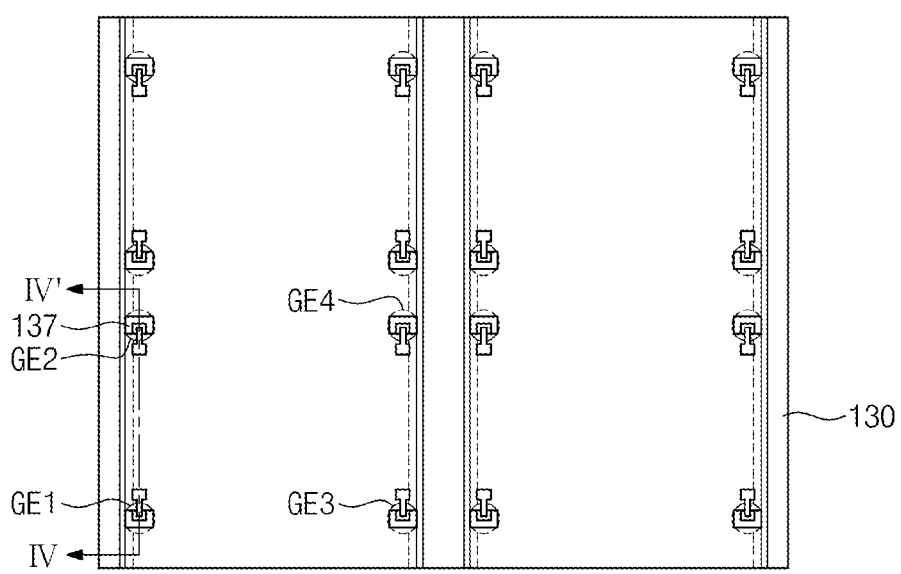
Figure 15C:
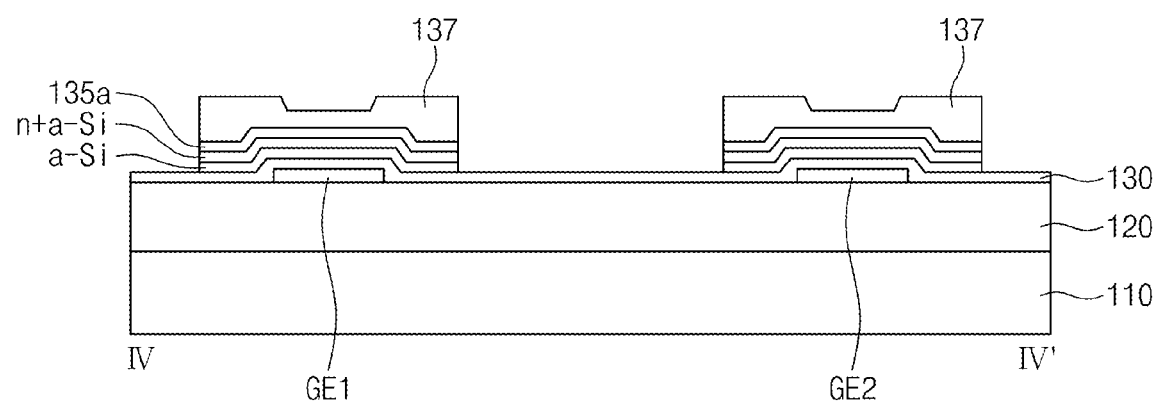

Referring to FIGS. 15A to 15C, the source/drain electrode material 135 is etched using the third photoresist pattern 137 as a mask to form a source/drain electrode pattern 135a. Then, the amorphous silicon layer 131 and the n+ amorphous silicon layer 133 are etched to form the active pattern.

Figure 15D:
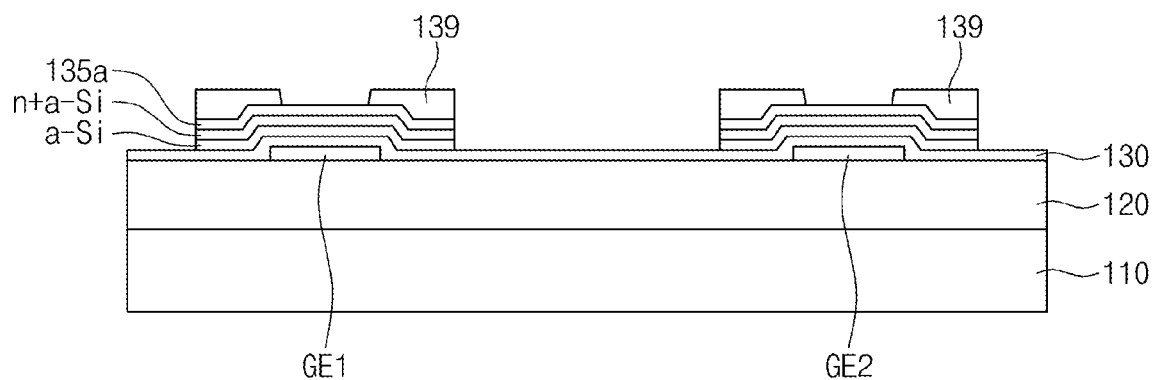

Referring to FIG. 15D, when an asking process is performed on the third photoresist pattern 137, the third photoresist pattern is removed from the upper of the channel region.

Figure 15E:
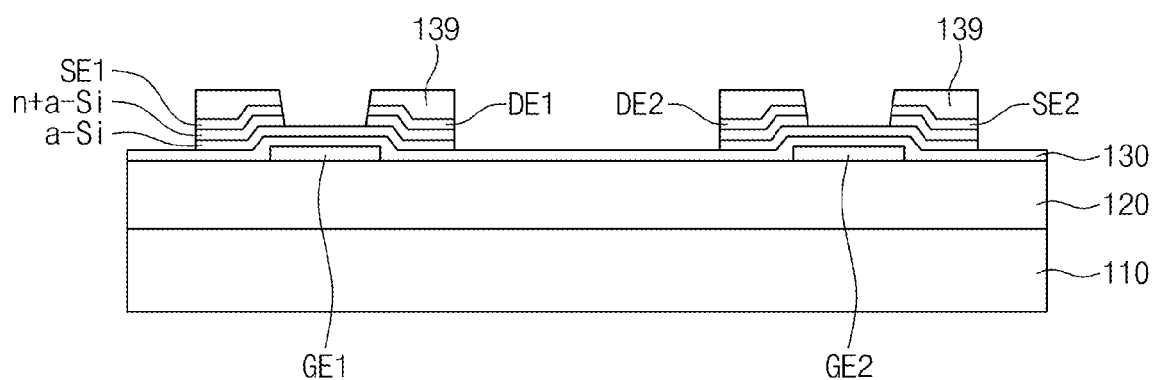

After that, when the source/drain electrode pattern 135a is etched using the ashed photoresist pattern as a mask, the source/drain electrode pattern 135a is separated into the source electrodes SE1 to SE4 and the drain electrodes DE1 to DE4 and the active pattern is exposed in the channel region as shown in FIG. 15E. The n+ amorphous silicon layer 133 exposed in the channel region is completely etched when the source/drain electrode pattern 135a is etched.

Figure 16A:
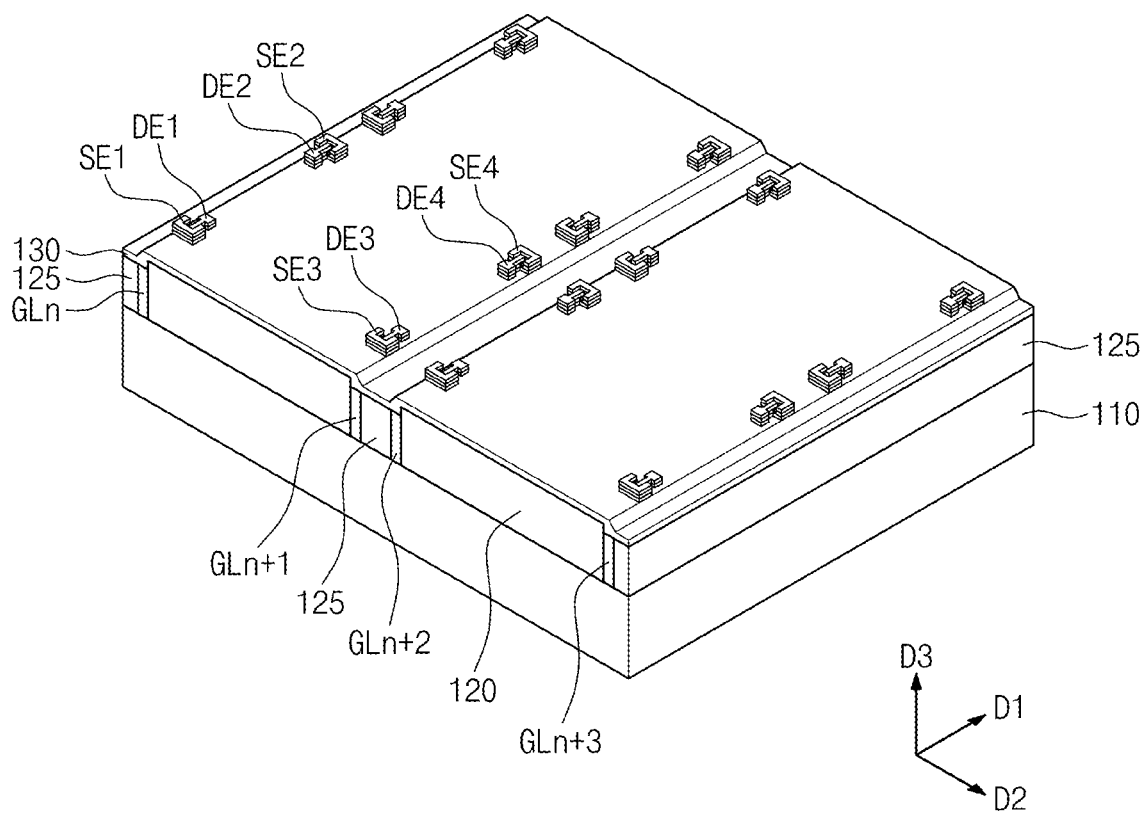
Figure 16B:
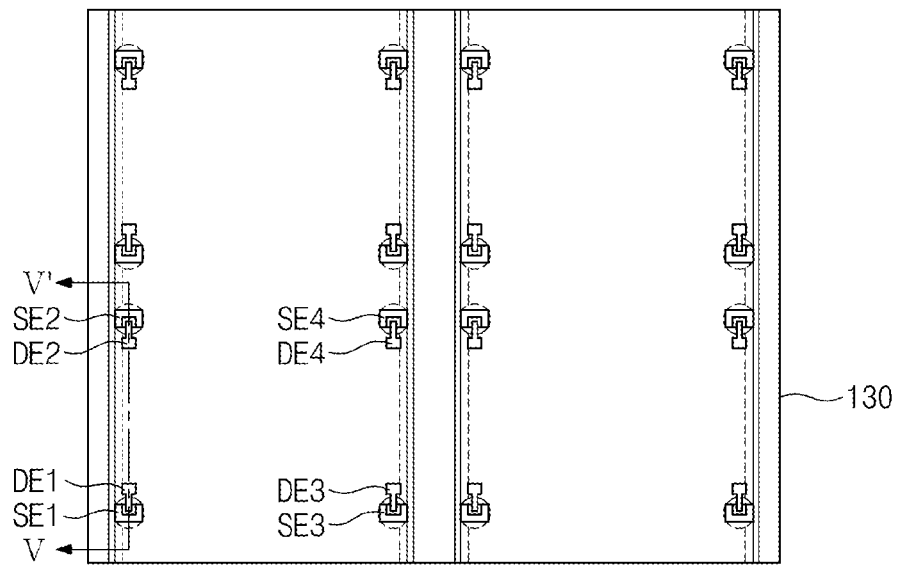
Figure 16C:
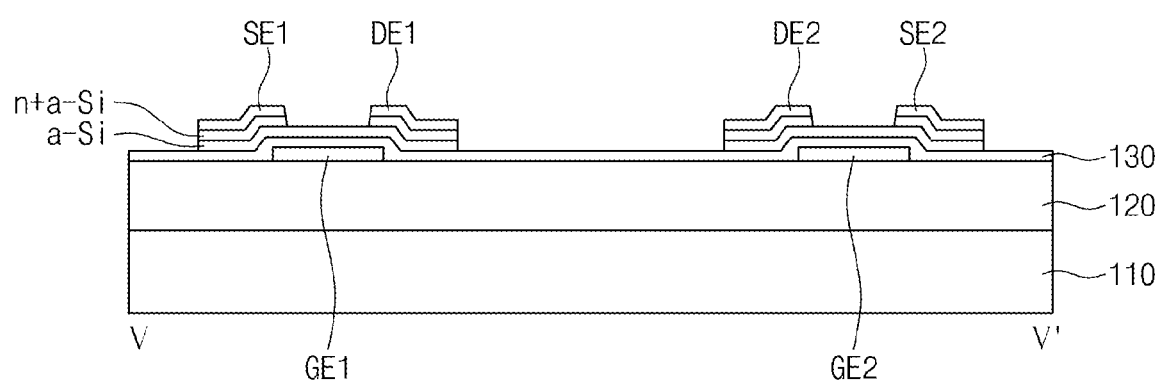

Then, when the third photoresist pattern 139 is removed, the thin film transistors TR1 to TR4 are completely formed on the base substrate 110 as shown in FIGS. 16A to 16C.

Figure 17A:
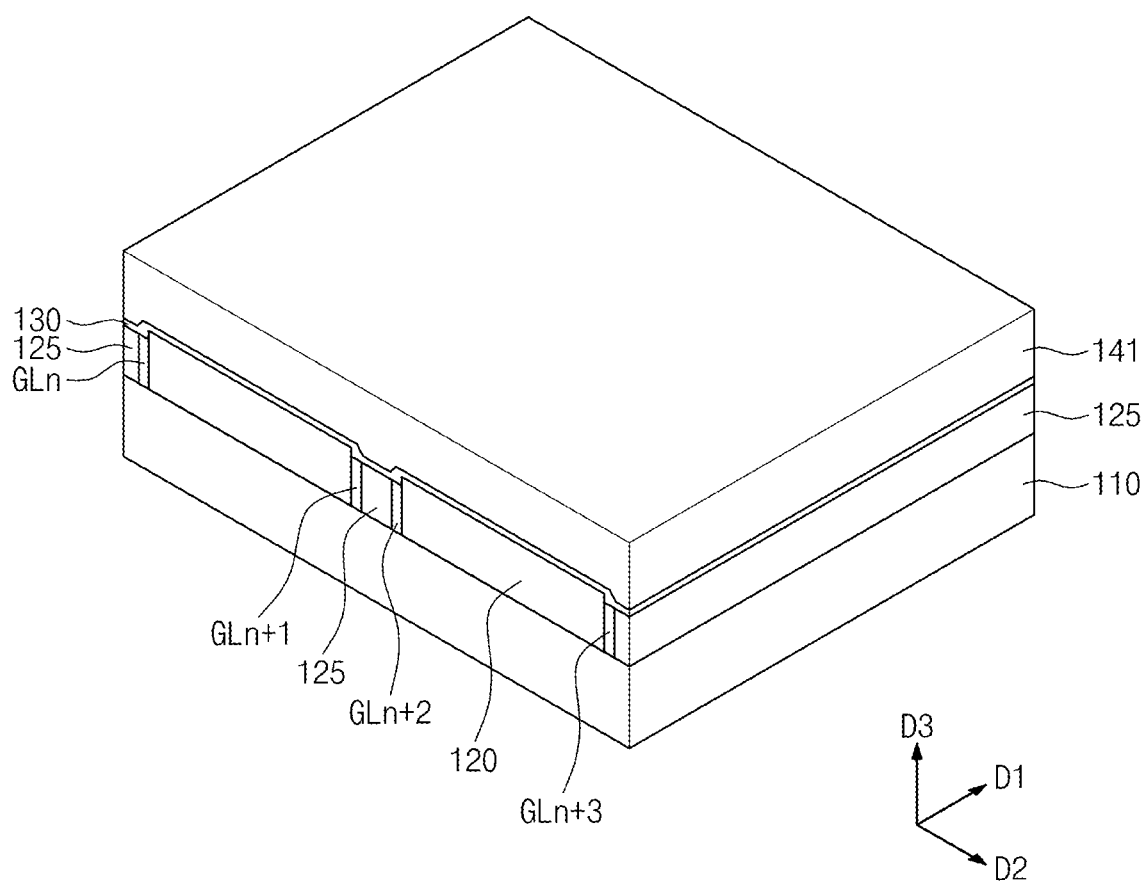
Figure 17B:
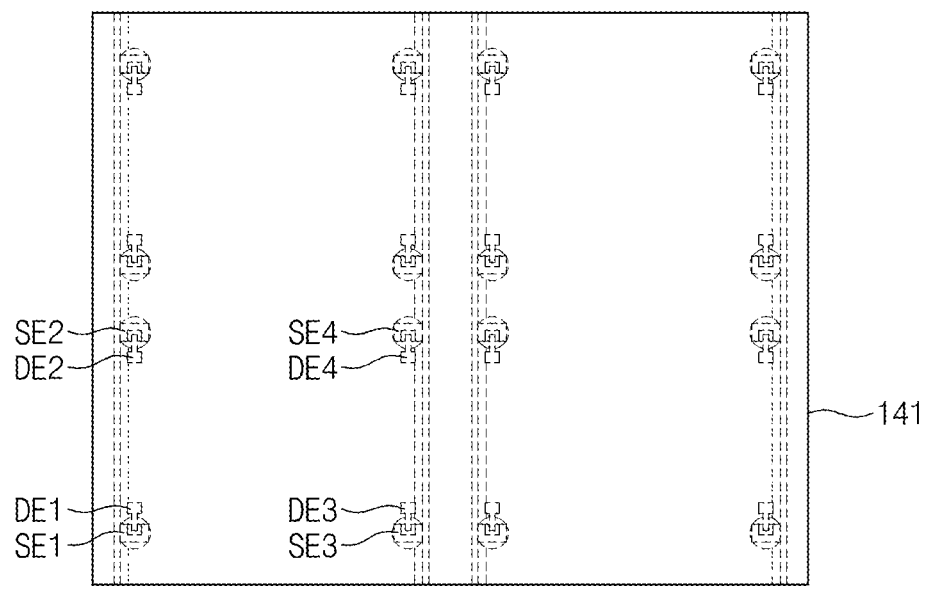

Referring to FIGS. 17A and 17B, a second insulating material 141 is formed on the gate insulating layer 130, the source electrodes SE1 to SE4, and the drain electrodes DE1 to DE4. The second insulating material 141 has a thickness determined by taking the thickness of the data lines DLm to DLm+3 into consideration. In addition, the second insulating material 141 includes the same material with high transmittance, such as silicon nitride (SiNx), silicon oxycarbide (SiOC), or polymer-based organic material, as the first insulating material 121.

Figure 18B:
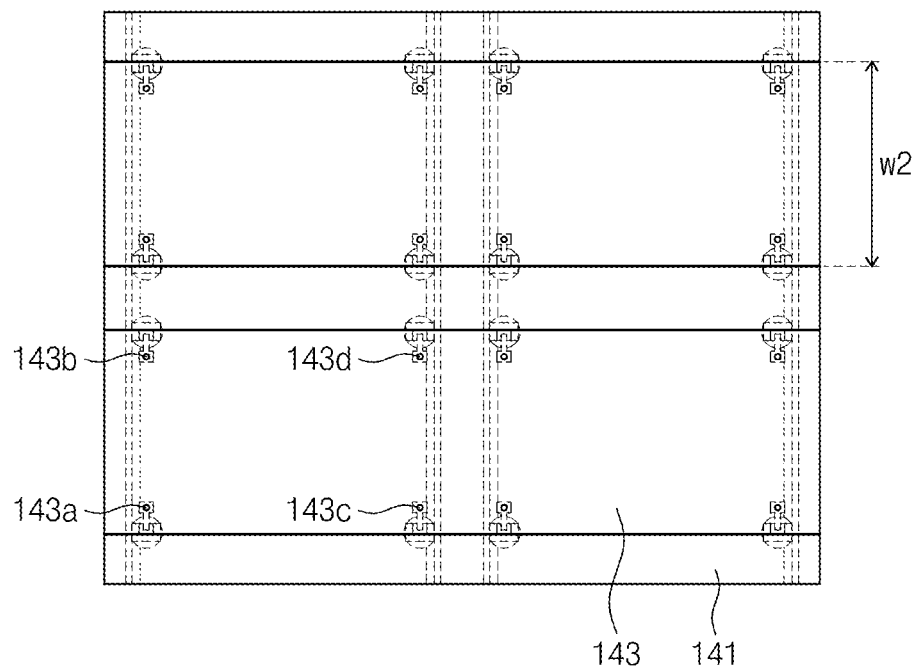

Referring to FIGS. 18A and 18B, a fourth photoresist pattern 143 is formed on the second insulating material 141. The fourth photoresist pattern 143 has a second width w2 in the first direction D1 and is spaced apart from another second photoresist pattern 143 adjacent thereto in the first direction D1. That is, the fourth photoresist patterns 143 extend in the second direction D2 and are arranged in the first direction D1 to be spaced apart from each other by a predetermined distance.

As an example, contact patterns 143a to 143d are formed on the fourth photoresist pattern 143. The contact patterns 143a to 143d may be formed above the drain electrodes DE1 to DE4.

If the second insulating material 141 is etched using the fourth photoresist pattern 143, the second column insulating layer 140 having the shape corresponding to the fourth photoresist pattern 143 is formed as shown in FIGS. 19A and 19B. The fourth photoresist pattern 143 is removed.

In addition, the second column insulating layer 140 includes first contact holes 140a to 140d formed to correspond to the contact patterns 143a to 143d. The first contact holes 140a to 140d are formed to correspond to the drain electrodes DE1 to DE4 and partially expose the drain electrodes DE1 to DE4. The second column insulating layer 140 is formed to expose at least a portion of the source electrodes SE1 to SE4.

Figure 20A:
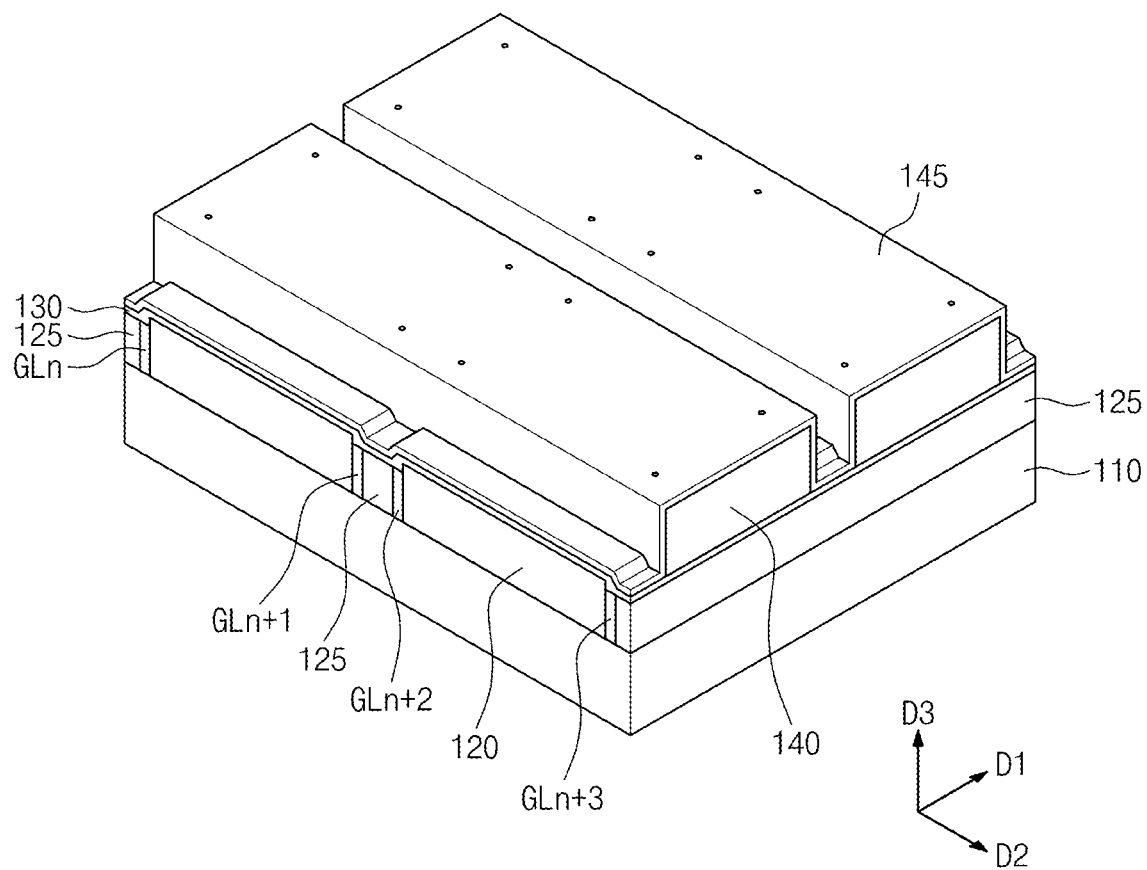
Figure 20B:
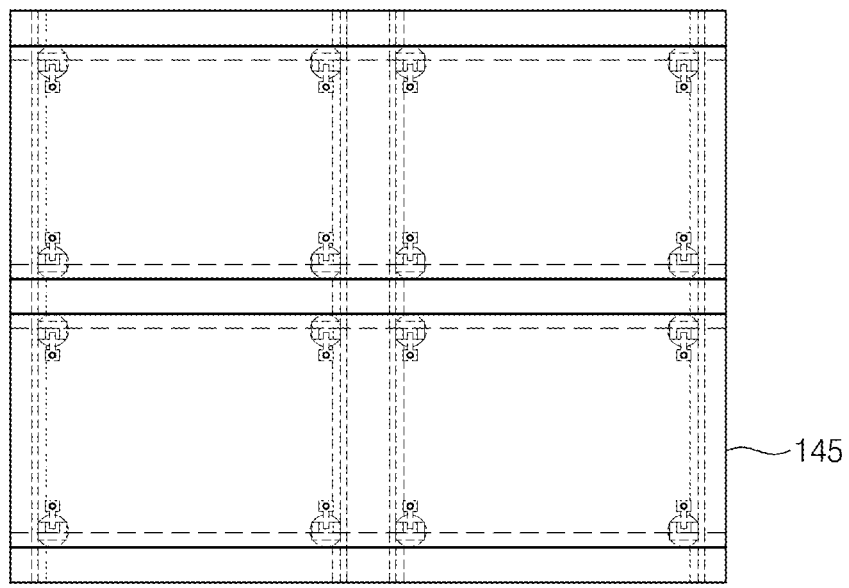

Referring to FIGS. 20A and 20B, a data-line material 145 is formed on the second column insulating layer 140 and the gate insulating layer 130. The data-line material 145 has a thickness determined by the width in the first direction D1 of the data lines DLm to DLm+3. The width of the data lines DLm to DLm+3 may be substantially identical to the thickness of the data-line material 145 disposed on the second column insulating layer 140.

Then, the data-line material 145 disposed on the upper surface of the second column insulating layer 140 is anisotropically etched. As an example, the anisotropic etching process is performed in a direction substantially vertical to the surface of the base substrate 110. Therefore, a portion of the data-line material 145, which is substantially in parallel to the surface of the base substrate 110, is removed by the anisotropic etching process and a portion of the data-line material 145, which is substantially vertical to the surface of the base substrate 110, is not removed by the anisotropic etching process.

Figure 21A:
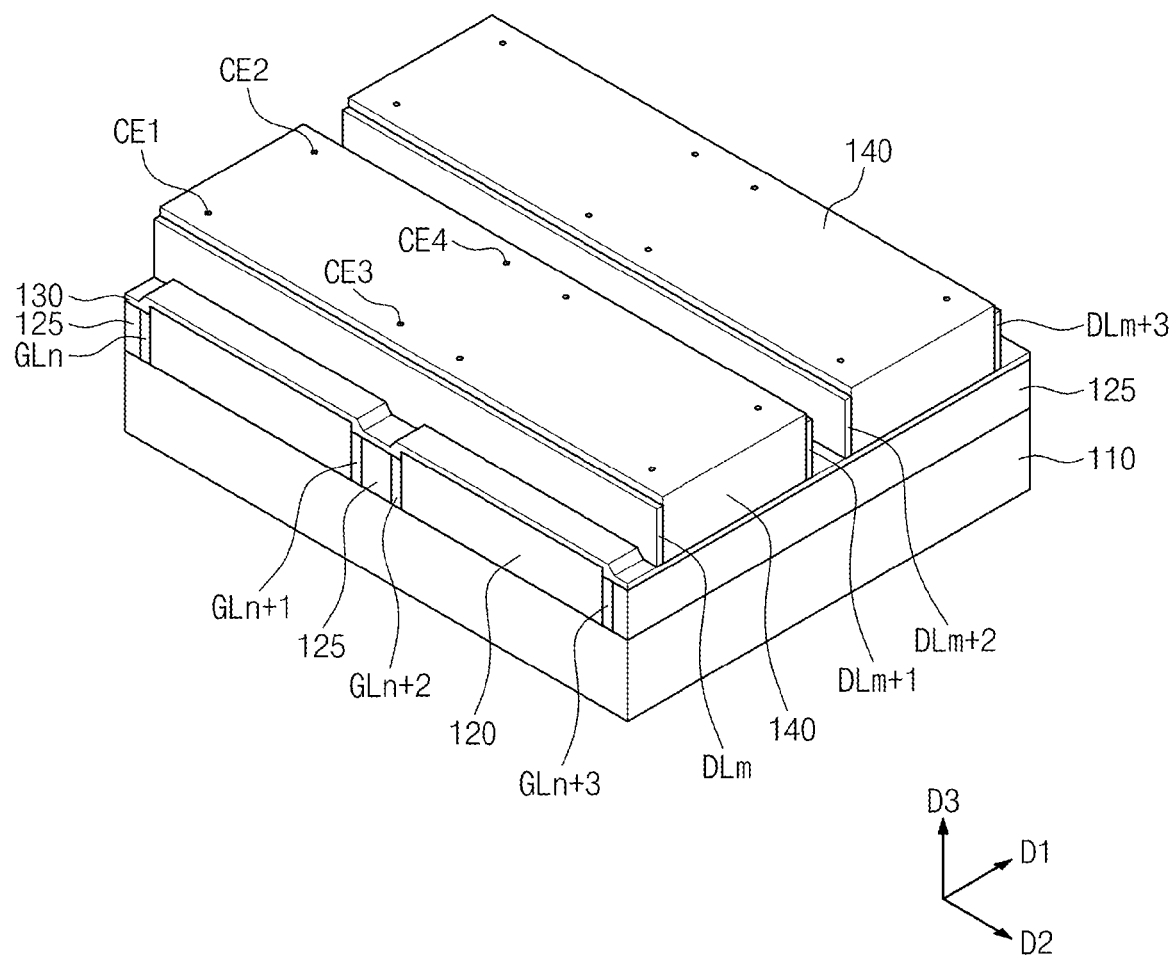
Figure 21B:
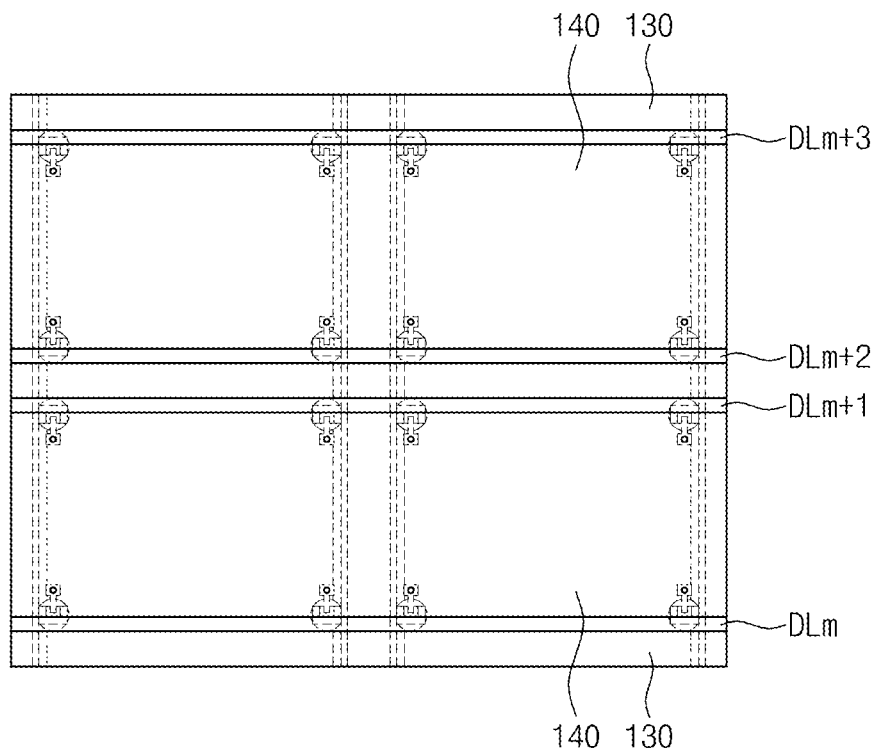

Thus, when the data-line material 145 is anisotropically etched, the data lines DLm to DLm+3 are formed along the sidewalls of the second column insulating layer 140 as shown in FIGS. 21A and 21B.

To prevent the vertical portion of the data-line material 145 disposed at the sidewalls of the second column insulating layer 140 from being etched, it is important to control an inclination angle of the sidewalls of the second column insulating layer 140. That is, when assuming that the inclination angle of the sidewalls of the second column insulating layer 140 is "θ2", the inclination angle θ2 may exist in a range of about 85 degrees to about 95 degrees. The inclination angle θ2 of the sidewalls preferably has an angle of about 90 degrees.

In addition, the data-line material 145 may be provided in the first contact holes 140a to 140d. The data-line material 145 may be formed along inner sidewalls of the second column insulating layer 140 that defines the first contact holes 140a to 140d or filled in the first contact holes 140a to 140d to form a cylindrical shape.

The vertical portion of the data-line material 145, which is formed along the inner sidewalls of the second column insulating layer 140, is not etched when the data-line material 145 is anisotropically etched. Therefore, the contact electrodes CE1 to CE4 having the pipe shape or cylindrical shape may be formed in the first contact holes 140a to 140d.

Although not shown in figures, the contact electrodes CE1 to CE4 make direct contact with the drain electrodes DE1 to DE4, respectively, and thus the contact electrodes CE1 to CE4 are electrically connected to the drain electrodes DE1 to DE4.

Figure 22A:
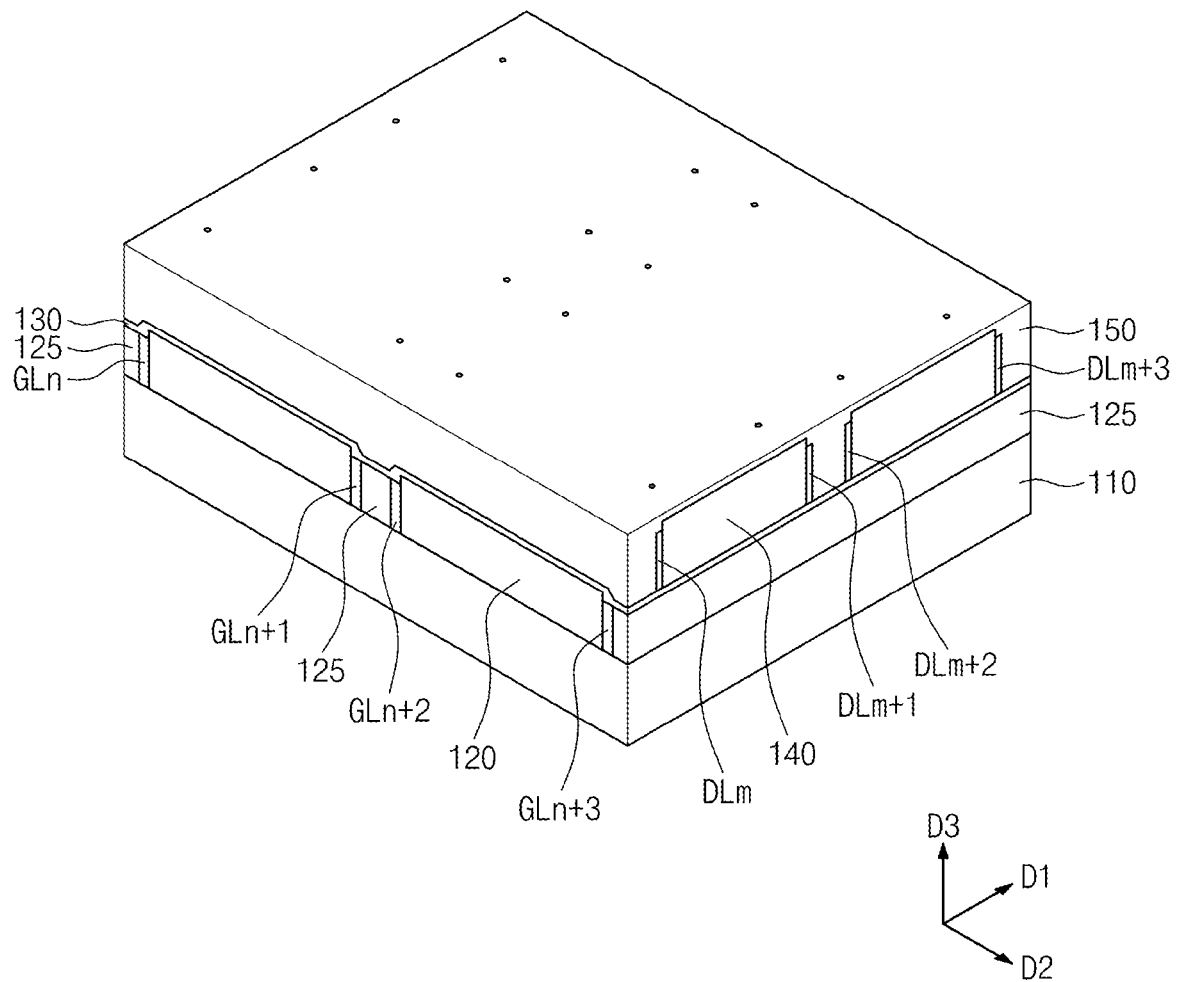
Figure 22B:
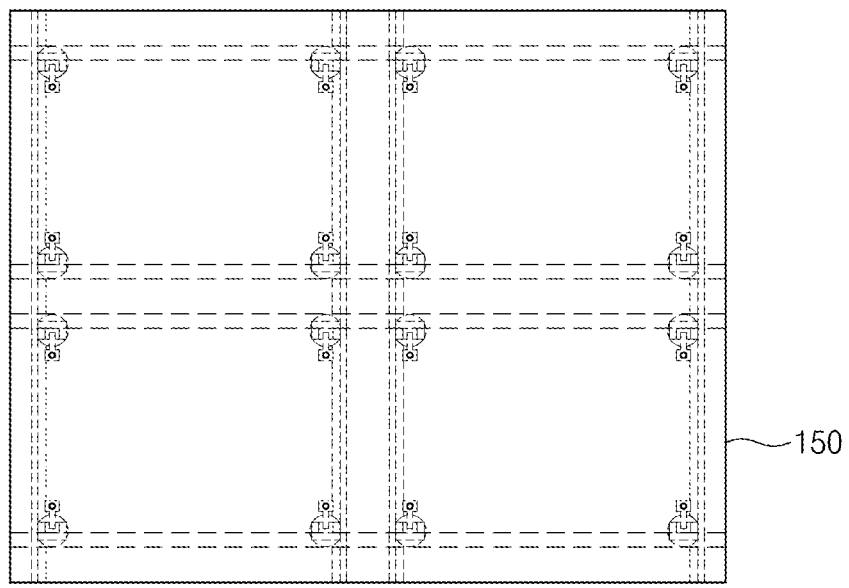
Figure 23A:
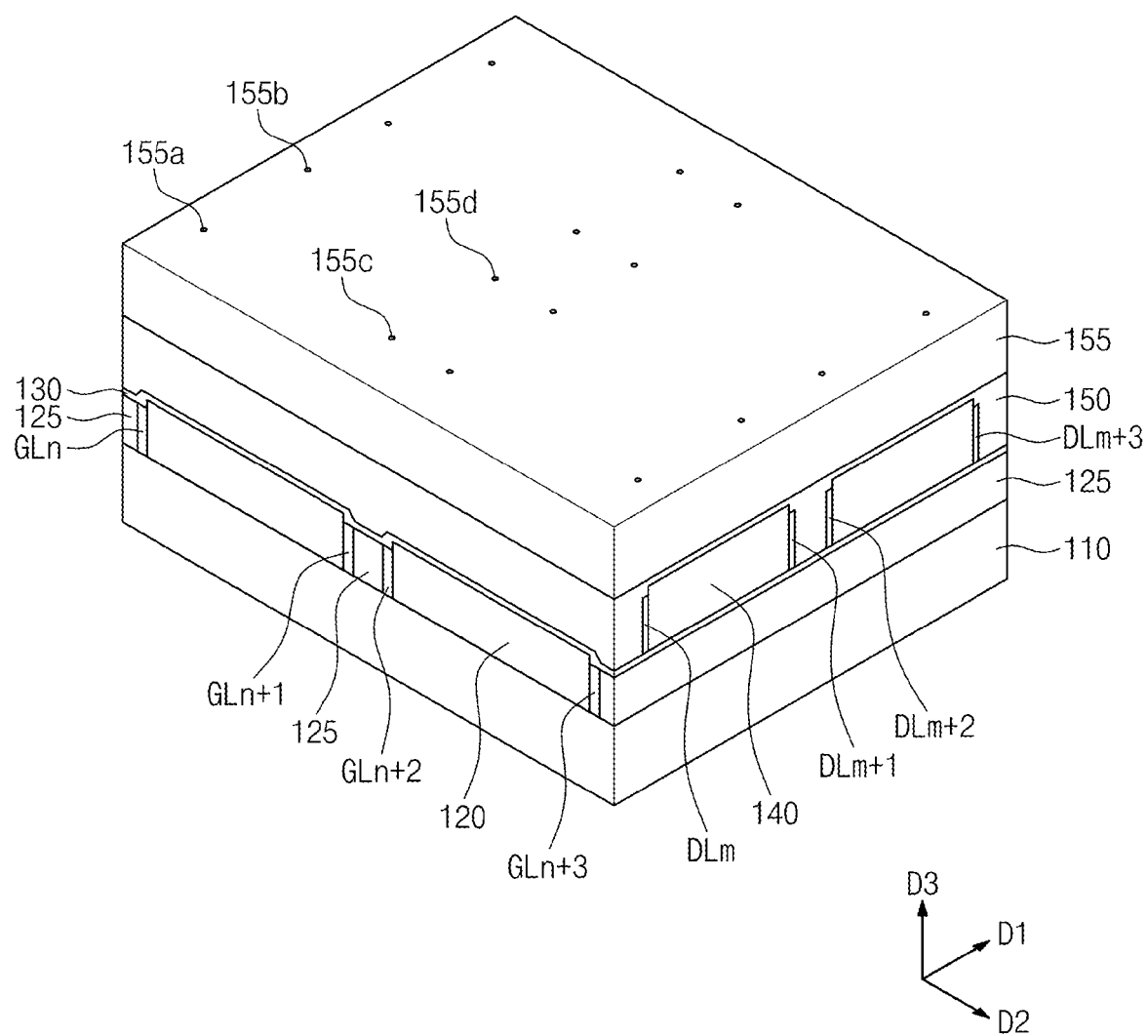
Figure 23B:
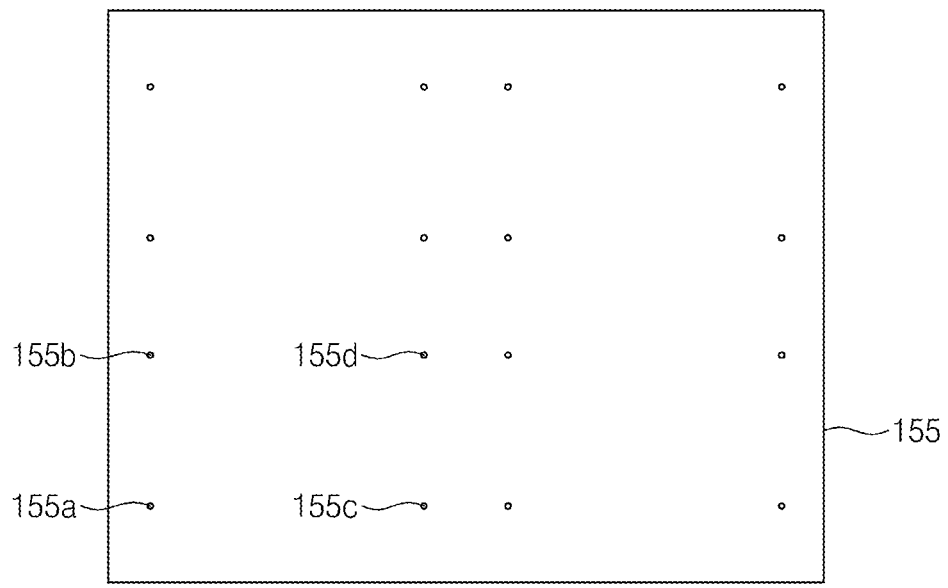
Figure 24A:
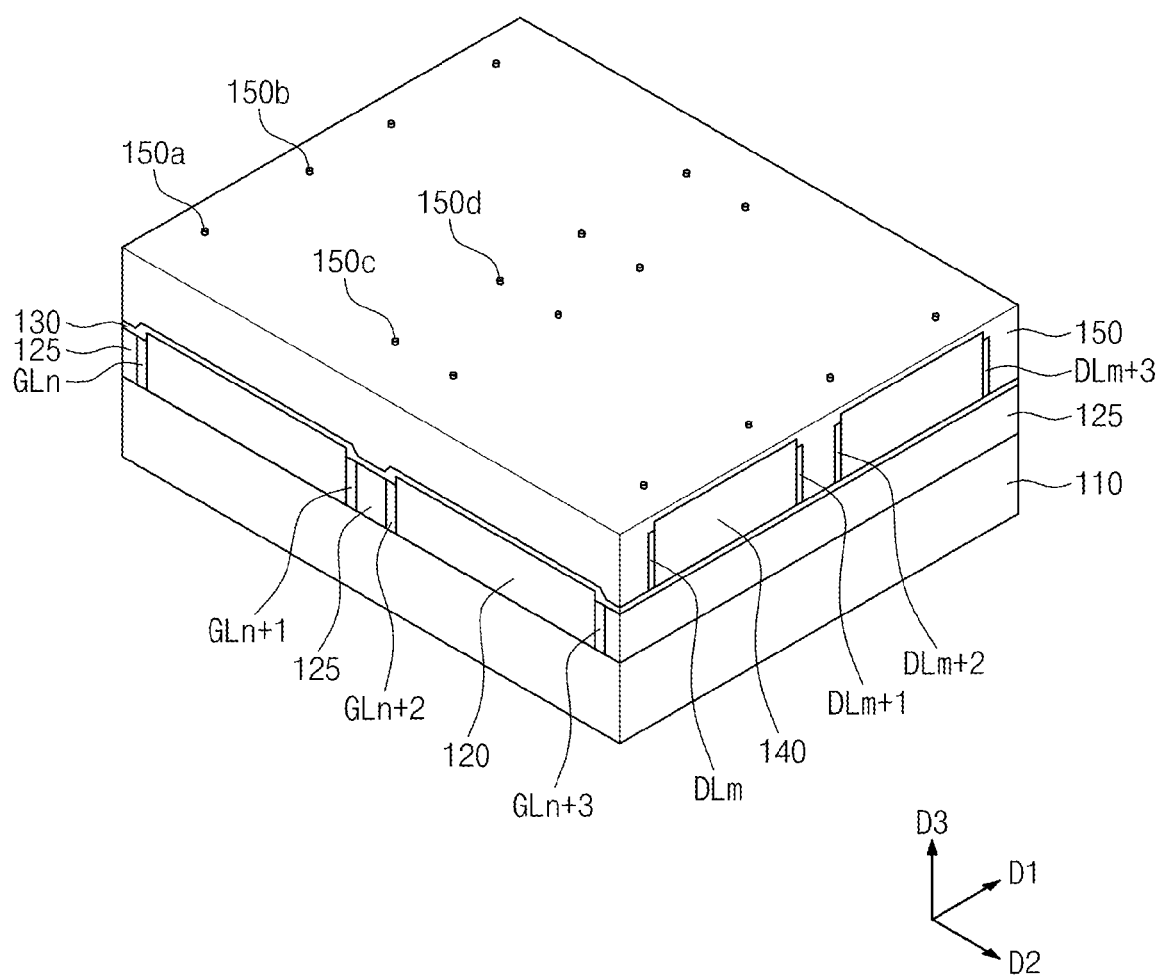
Figure 24B:
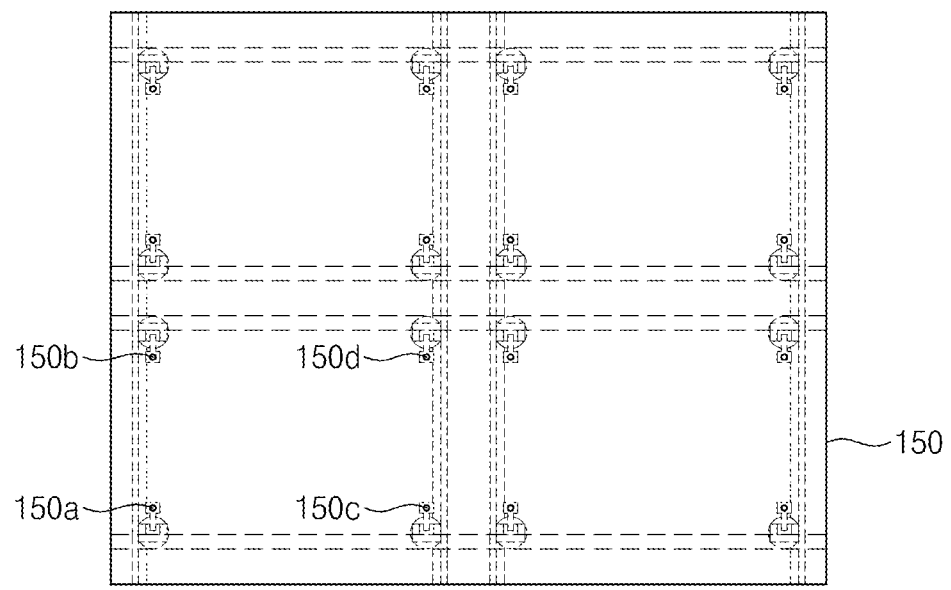

Referring to FIGS. 22A and 22B, the upper surfaces of the data lines DLm to DLm+3 and the second column insulating layer 140 are covered by the protective layer 150. As shown in FIGS. 23A and 24B, a fifth photoresist pattern 155 is formed on the protective layer 150. The fifth photoresist pattern 155 includes second contact patterns 155a to 155d corresponding to the first contact holes 140a to 140d.

When the protective layer 150 is etched using the fifth photoresist pattern 155 as a mask, second contact holes 150a to 150d are formed through the protective layer 150 to respectively correspond to the first contact holes 140a to 140d. The contact electrodes CE1 to CE4 are exposed through the second contact holes 150a to 150d.

Figure 25A:
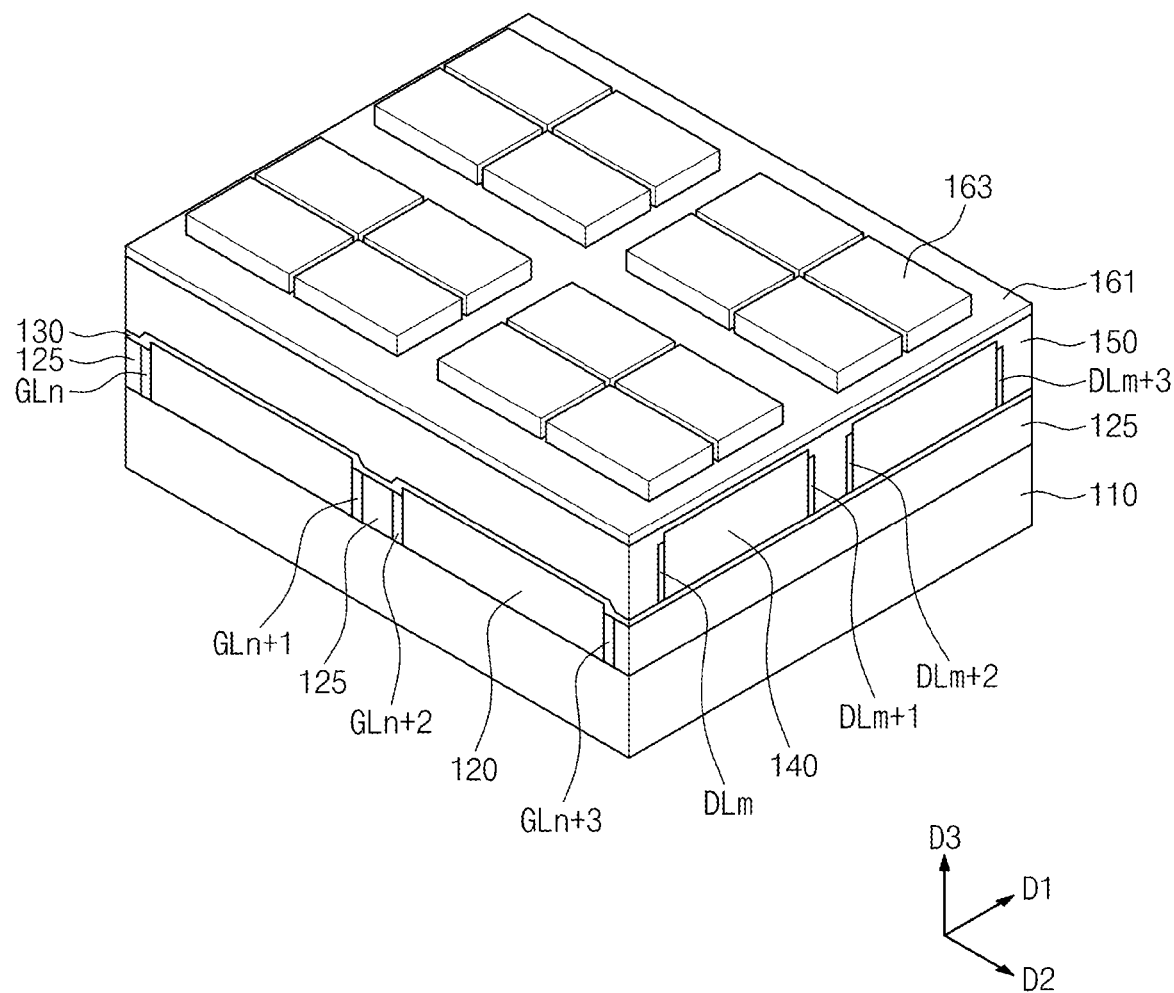
Figure 25B:
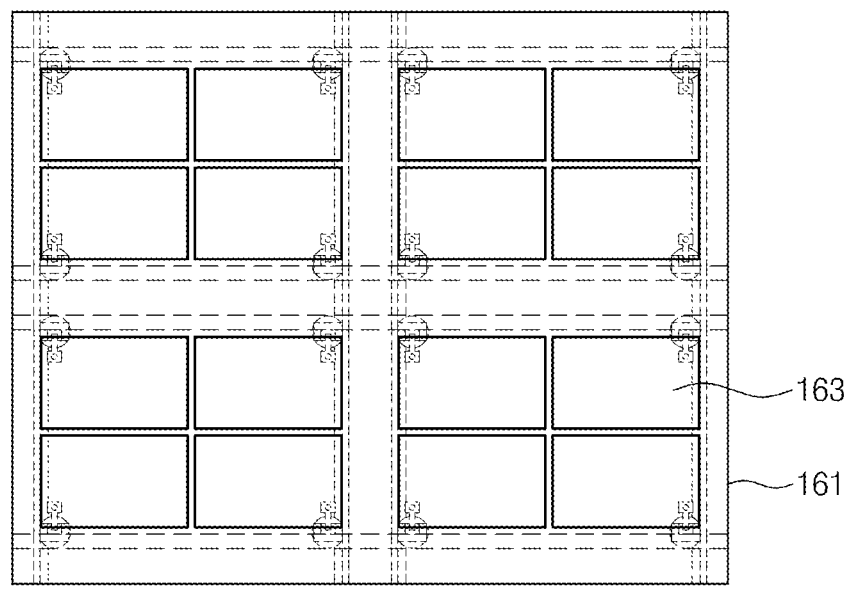

Referring to FIGS. 25A and 25B, a transparent conductive material 161 is formed on the protective layer 150 and a sixth photoresist pattern 163 is formed on the transparent conductive material 161. When the transparent conductive material 161 is etched using the sixth photoresist pattern 163 as a mask, the first to fourth pixel electrodes PE1 to PE4 are formed on the protective layer 150. In detail, the first to fourth pixel electrodes PE1 to PE4 make direct contact with the contact electrodes CE1 to CE4 exposed through the second contact holes 150a to 150d. Thus, the first to fourth pixel electrodes PE1 to PE4 may be electrically connected to the first to fourth drain electrodes DE1 to DE4, respectively, via the contact electrodes CE1 to CE4.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A display panel comprising:
    a plurality of gate lines configured to extend in a first direction, the plurality of gate lines including a first gate line and a second gate line corresponding to the first gate line;
    a first column insulating layer including a first sidewall and a second sidewall opposing the first sidewall, the first column insulating layer being configured to be interposed between the first gate line and the second gate line;
    a gate electrode configured to be branched from a corresponding gate line of the plurality of gate lines and disposed on the first column insulating layer;
    a gate insulating layer configured to cover the first column insulating layer, the gate lines, and the gate electrode;
    an active layer configured to be disposed on the gate insulating layer to face the gate electrode;
    source and drain electrodes configured to be spaced apart from each other above the active layer;
    a plurality of data lines configured to overlap the source electrode and extend in a second direction;
    a second column insulating layer configured to be interposed between the data lines and include a first contact hole formed therethrough to expose the drain electrode;
    a contact electrode configured to be disposed in the first contact hole and electrically connected to the drain electrode;
    a protective layer configured to cover the second column insulating layer and the data lines and include a second contact hole formed therethrough to correspond to the first contact hole; and
    a pixel electrode configured to be electrically connected to the contact electrode through the second contact hole,
    wherein the first gate line and the second gate line are formed on the first sidewall and the second sidewall of the first column insulating layer, respectively.

2. The display panel of claim 1, wherein a ratio of a thickness in a third direction of each of the gate lines to a width in the second direction of each of the gate lines is greater than 1.

3. The display panel of claim 2, wherein the gate electrode extends in the second direction on the first column insulating layer.

4. The display panel of claim 1, wherein a ratio of a thickness in a third direction of each of the data lines to a width in the first direction of each of the data lines is greater than 1.

5. The display panel of claim 1, wherein an N-th gate line and an (N+1)th gate line among the gate lines are spaced apart from each other by a first distance, the (N+1)th gate line and an (N+2)th gate line among the gate lines are spaced apart from each other by a second distance smaller than the first distance, an M-th data line and an (M+1)th data line among the data lines are spaced apart from each other by a third distance, and the (M+1)th data line and an (M+2)th data lines among the data lines are spaced apart from each other by a fourth distance smaller than the third distance.

6. The display panel of claim 5, wherein a first pixel connected to the N-th gate line and the M-th data line, a second pixel connected to the N-th gate line and the (M+1)th data line, a third pixel connected to the (N+1)th gate line and the M-the data line, and a fourth pixel connected to the (N+1)th gate line and the (M+1)th data line are arranged in the rectangular area defined by the N-th gate line, (N+1)th gate line, the M-th data line and (M+1)th data line.

7. The display panel of claim 6, wherein the first to fourth pixels comprise first to fourth pixel electrodes, respectively, and the gate lines and the data lines are not disposed between the first to fourth pixel electrodes.

8. The display panel of claim 1, wherein the plurality of data lines further includes a first data line and a second data line corresponding to the first data line, the second column insulating layer includes a third sidewall and a fourth sidewall opposing the third sidewall, and the first data line and the second data line are formed on the third sidewall and the fourth sidewall of the second column insulating layer, respectively.

9. The display panel of claim 1, wherein the first column insulating layer and the second column insulating layer intersect in a plan view.

* * * * *